US012642051B2

(12) United States Patent
Robles et al.

(10) Patent No.: US 12,642,051 B2
(45) Date of Patent: May 26, 2026

(54) SEMICONDUCTOR DEVICE CARRIERS AND METHODS OF MAKING AND USING

(71) Applicant: UTAC Headquarters Pte. Ltd., Singapore (SG)

(72) Inventors: Roel Adeva Robles, Singapore (SG); Chee Kay Chow, Singapore (SG)

(73) Assignee: UTAC Headquarters Pte. Ltd., Singapore (SG)

( * ) Notice: Subject to any disclaimer, the term of this patent is extended or adjusted under 35 U.S.C. 154(b) by 368 days.

(21) Appl. No.: 18/448,667

(22) Filed: Aug. 11, 2023

(65) Prior Publication Data

US 2024/0055292 A1 Feb. 15, 2024

Related U.S. Application Data

(60) Provisional application No. 63/380,016, filed on Oct. 18, 2022, provisional application No. 63/371,413, filed on Aug. 15, 2022.

(51) Int. Cl.
*H01L 21/68* (2006.01)
*H10P 72/70* (2026.01)

(52) U.S. Cl.
CPC ...... *H10P 72/7402* (2026.01); *H10P 72/7408* (2026.01); *H10P 72/7412* (2026.01); *H10P 72/7428* (2026.01)

(58) Field of Classification Search
CPC ....... H01L 21/6836; H01L 2221/68309; H01L 2221/68318; H01L 2221/68354; H01L 2221/68345; H01L 21/6835; H01L 2221/68327

USPC ......................................................... 438/106
See application file for complete search history.

(56) References Cited

U.S. PATENT DOCUMENTS

| | | | | |
|---|---|---|---|---|
| 5,518,410 A * | 5/1996 | Masami | ............. | H01R 13/2485 439/700 |
| 5,955,888 A * | 9/1999 | Frederickson | ....... | H05K 7/1061 439/700 |
| 6,053,485 A * | 4/2000 | Pan | ........................ | B01D 3/163 261/114.4 |
| 6,720,783 B2 * | 4/2004 | Satoh | ................... | G01R 1/0433 324/754.08 |
| 6,858,932 B2 * | 2/2005 | Gerber | ................ | H01L 23/4334 257/713 |
| 6,913,468 B2 * | 7/2005 | Dozier, II | ............... | H01L 24/12 257/E21.507 |
| 6,958,616 B1 * | 10/2005 | Mahoney | ........... | H01R 13/2421 324/755.05 |
| 7,316,573 B2 * | 1/2008 | Xie | ...................... | H05K 7/1061 439/66 |

(Continued)

*Primary Examiner* — Vu A Vu
(74) *Attorney, Agent, or Firm* — Brian M. Kaufman; Robert D. Atkins; PATENT LAW GROUP: Atkins and Associates, P.C.

(57) ABSTRACT

A first carrier has a first plate. A tape is disposed on the first plate. A second plate is disposed over the first plate. The second plate has a trench aligned to the tape and an opening formed through the second plate over the tape. A singulated semiconductor package is disposed on the tape in the opening of the second plate. A second carrier has a static datum and a movable datum. The movable datum is moved toward the static datum. An aperture substrate is disposed around the static datum and movable datum. A manufacturing process is performed on the aperture substrate.

17 Claims, 26 Drawing Sheets

(56)                    References Cited

U.S. PATENT DOCUMENTS

| | | | | |
|---|---|---|---|---|
| 7,514,946 B2 * | 4/2009 | Soeta | ................. | G01R 31/2865 |
| | | | | 324/750.09 |
| 7,619,426 B2 * | 11/2009 | Takeshita | ........... | G01R 31/2874 |
| | | | | 324/756.07 |
| 8,039,944 B2 * | 10/2011 | Ju | ........................ | H05K 7/1069 |
| | | | | 257/690 |
| 8,624,388 B2 * | 1/2014 | Sun | .................... | H10H 20/8583 |
| | | | | 257/713 |
| 8,786,064 B2 * | 7/2014 | Kim | ................. | H01L 23/49524 |
| | | | | 257/676 |
| 9,199,206 B2 * | 12/2015 | Pilling | ................... | B01D 3/163 |
| 9,346,151 B2 | 5/2016 | Di Stefano | | |
| 10,259,206 B2 * | 4/2019 | Brown | .............. | H01L 21/67132 |
| 11,036,309 B2 * | 6/2021 | Geiger | ................. | G06F 3/0312 |
| 2013/0323907 A1 * | 12/2013 | Oosterhuis | ........... | H01L 21/683 |
| | | | | 156/752 |

* cited by examiner

SEMICONDUCTOR DEVICE CARRIERS AND METHODS OF MAKING AND USING

CLAIM OF DOMESTIC PRIORITY

The present application claims the benefit of U.S. Provisional Application No. 63/371,413, filed Aug. 15, 2022. The present application further claims the benefit of U.S. Provisional Application No. 63/380,016, filed Oct. 18, 2022, both of which applications are incorporated herein by reference.

FIELD OF THE INVENTION

The present invention relates in general to semiconductor devices and, more particularly, to semiconductor device carriers and methods of making and using.

BACKGROUND OF THE INVENTION

Semiconductor devices are commonly found in modern electronic products. Semiconductor devices perform a wide range of functions, such as signal processing, high-speed calculations, sensors, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

The manufacturing process for semiconductor devices commonly uses carriers to hold individual semiconductor substrates while devices are being formed. Carriers may also be used to hold singulated semiconductor packages for further processing. Carriers need to be able to reliably hold the devices being processed securely in a known position. One type of carrier that is commonly used is known as a JEDEC tray. However, JEDEC trays are limited to a processing temperature of only 150 degrees Celsius and have other significant shortcomings. Therefore, a need exists for improved semiconductor device carriers.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 1A:
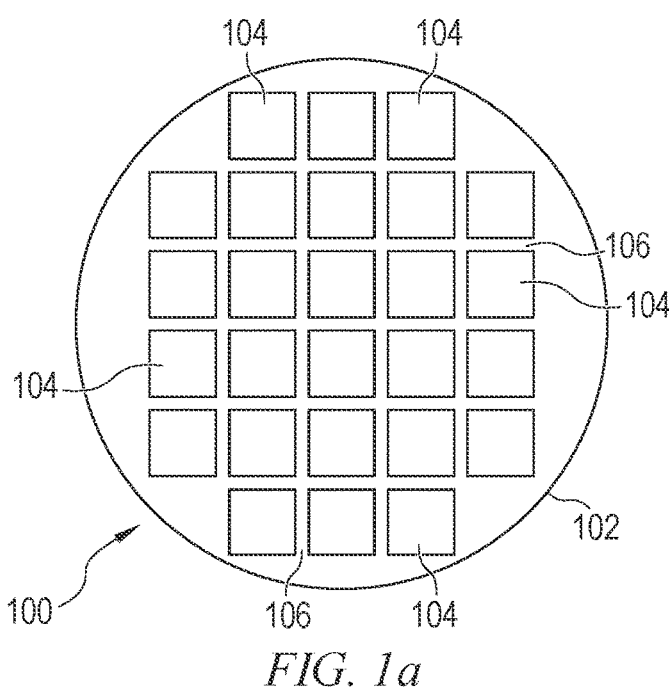
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
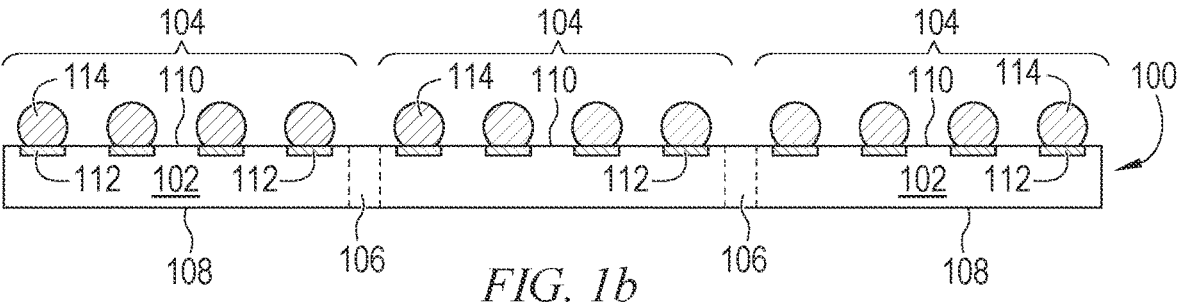

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as a digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bumps, micro bumps, or another type of electrical interconnect.

Figure 1C:
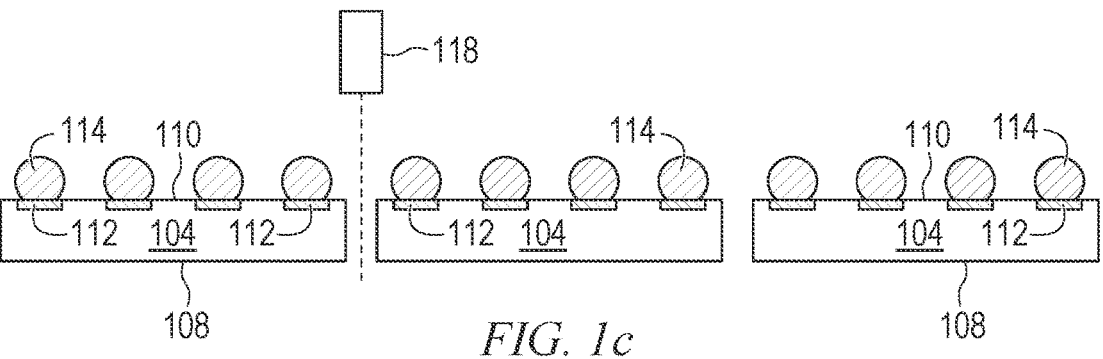

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figures 2A, 2B, 2C:
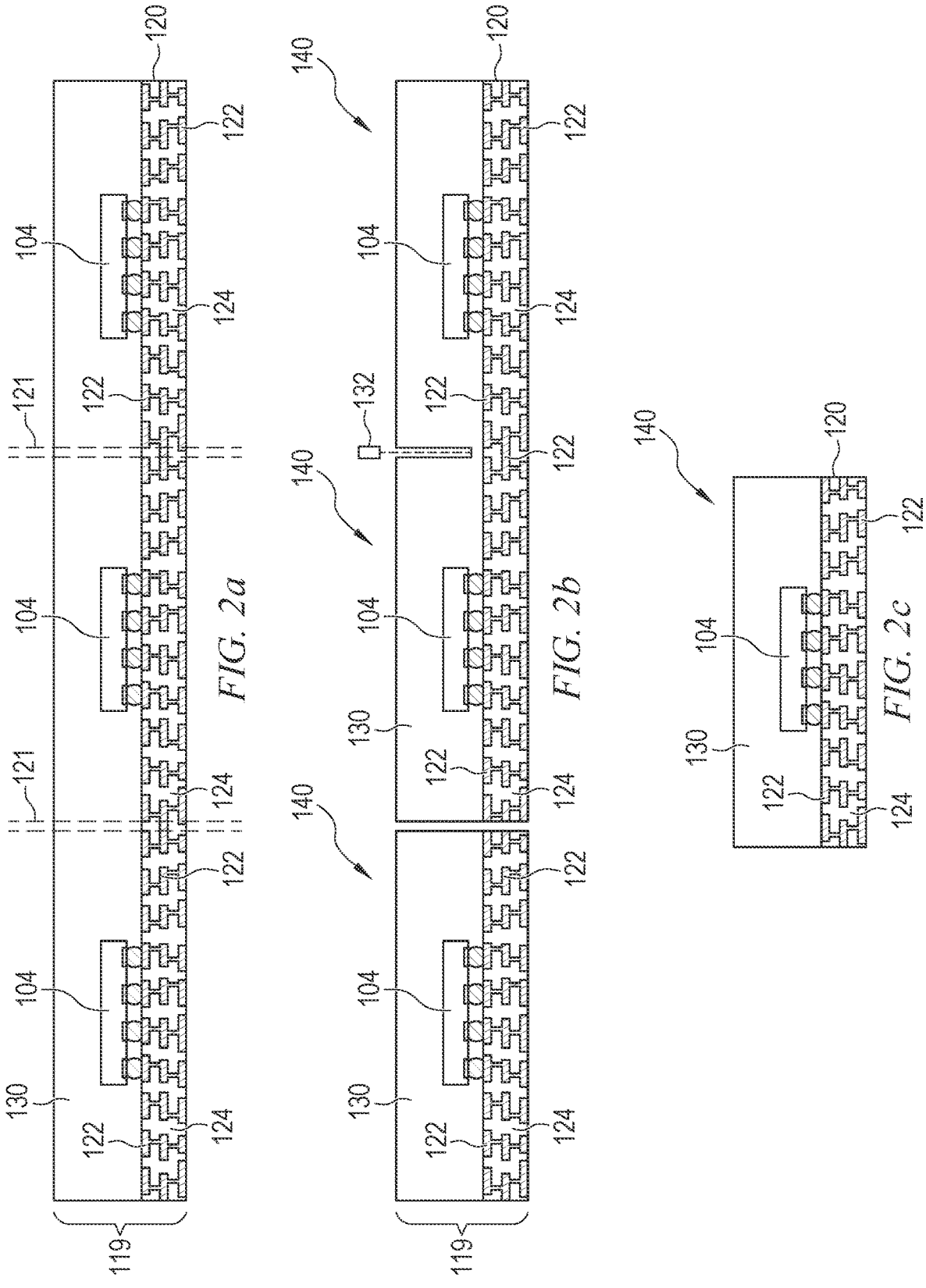
FIGS. 2a-2c illustrate forming a semiconductor package.

FIGS. 2a-2c illustrate manufacturing semiconductor packages with semiconductor die 104. FIG. 2a shows a cross-sectional view of a panel 119 of semiconductor packages being manufactured. A multi-layered interconnect substrate 120 includes conductive layers 122 and insulating layers 124. While only a single substrate 120 suitable to form three semiconductor packages separated by saw streets 121 is shown, hundreds or thousands of units are commonly manufactured and processed as part of a single substrate 120 before being singulated from each other, using the same steps described herein performed en masse. A separate substrate 120 could also be used for each unit being manufactured, the substrate being singulated before the step shown in FIG. 2a and a plurality of individual substrates being placed on a common carrier for processing.

Conductive layer 122 can be one or more layers of Al, Cu, Sn, Ni, Au, Ag, or other suitable electrically conductive material. Conductive layers can be formed using PVD, CVD, electrolytic plating, electroless plating, or another suitable metal deposition process. Conductive layer 122 provides horizontal electrical interconnect across substrate 120 and vertical electrical interconnect between the top and bottom surfaces of substrate 120. Portions of conductive layer 122 can be electrically common or electrically isolated depending on the design and function of the package being formed.

Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers can be formed using PVD, CVD, printing, lamination, spin coating, spray coating, sintering, or thermal oxidation. Insulating layer 124 provides physical support for, and electrical isolation between, conductive layers 122. Any number of conductive layers 122 and insulating layers 124 can be interleaved over each other to form substrate 120. Any other suitable type of package substrate or leadframe is used for substrate 120 in other embodiments.

Conductive layer 122 includes a plurality of contact pads formed over the bottom surface of substrate 120 for external interconnect of the final package. Conductive layer 122 includes a plurality of contact pads on its top surface for mounting of a semiconductor die 104. Contact pads also exist as part of conductive layer 122 for any other desired uses, e.g., mounting additional electrical components to supplement the functionality of semiconductor die 104. For example, the electrical components can be discrete electrical devices, such as diodes, transistors, resistors, capacitors, and inductors, other semiconductor die, semiconductor packages, surface mount devices, RF components, and discrete electrical devices. Any number and type of electrical components can be mounted onto substrate 120.

Semiconductor die 104 are positioned over substrate 120 using a pick and place machine or operation, oriented with active surface 110 toward substrate 120, and placed with solder bumps 114 in contact with contact pads of conductive layer 122. Solder bumps 114 are reflowed to physically and electrically connect semiconductor die 104 to substrate 120.

An encapsulant or molding compound 130 is deposited over and around substrate 120, semiconductor die 104, and any other electrical components on the substrate using a paste printing, compressive molding, transfer molding, liquid encapsulant molding, vacuum lamination, spin coating, or other suitable applicator. Encapsulant 130 can be liquid or granular polymer composite material, such as epoxy resin, epoxy acrylate, or another suitable polymer, with or without a suitable filler. Encapsulant 130 is non-conductive, provides structural support, and environmentally protects the semiconductor device from external elements and contaminants.

In FIG. 2b, encapsulant 130 and substrate 120 are singulated using a saw blade or laser cutting tool 132 to separate semiconductor die 104 into semiconductor packages 140. FIG. 2c shows a singulated semiconductor package 140. Often, semiconductor packages 140 still require additional processing after being singulated, e.g., forming shielding layers or cleaning. Semiconductor package 140 represents only one of a myriad of package types that can be processed per the following disclosure.

Figure 3A:
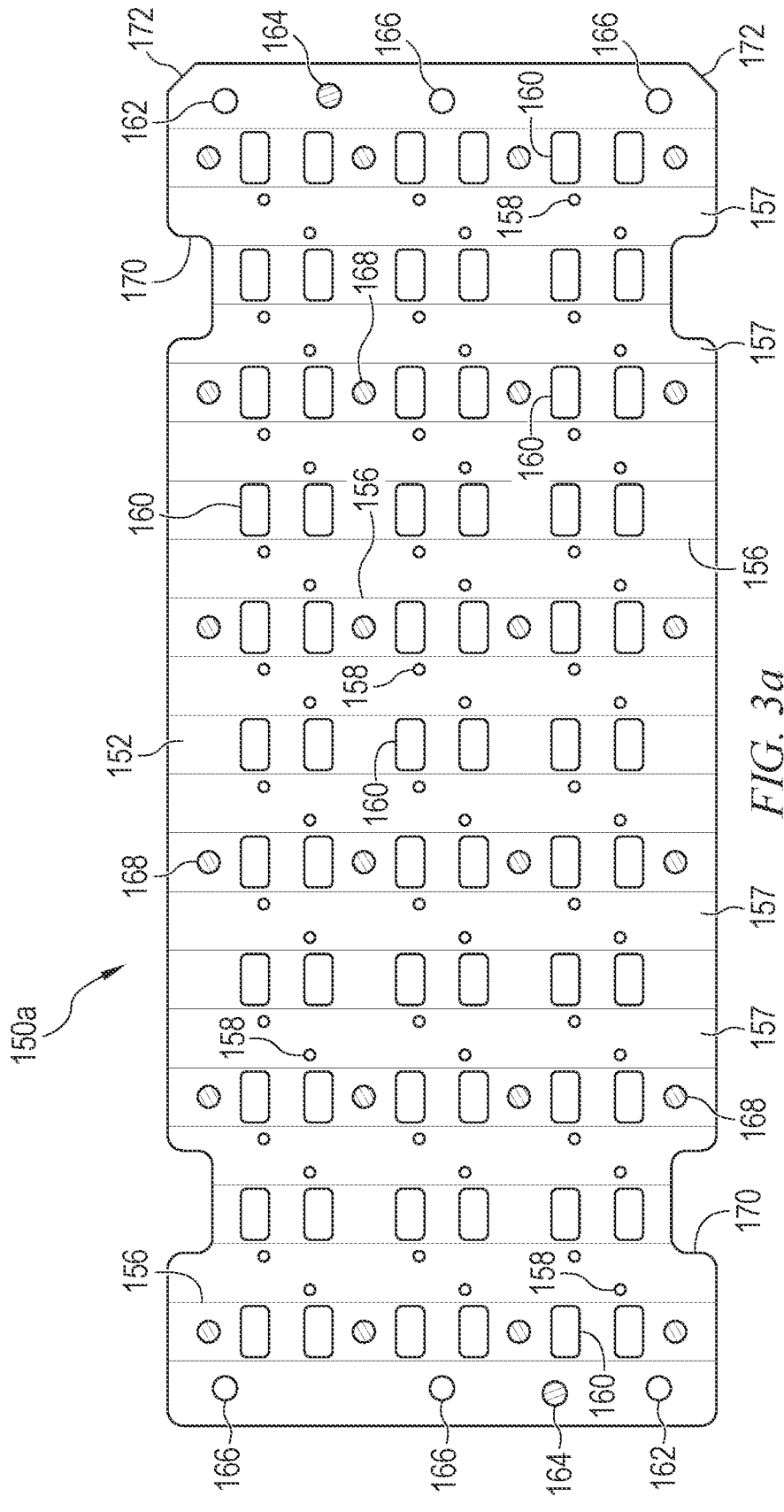
FIGS. 3a-3e illustrate a semiconductor package carrier formed from two metal plates.
Figure 3B:
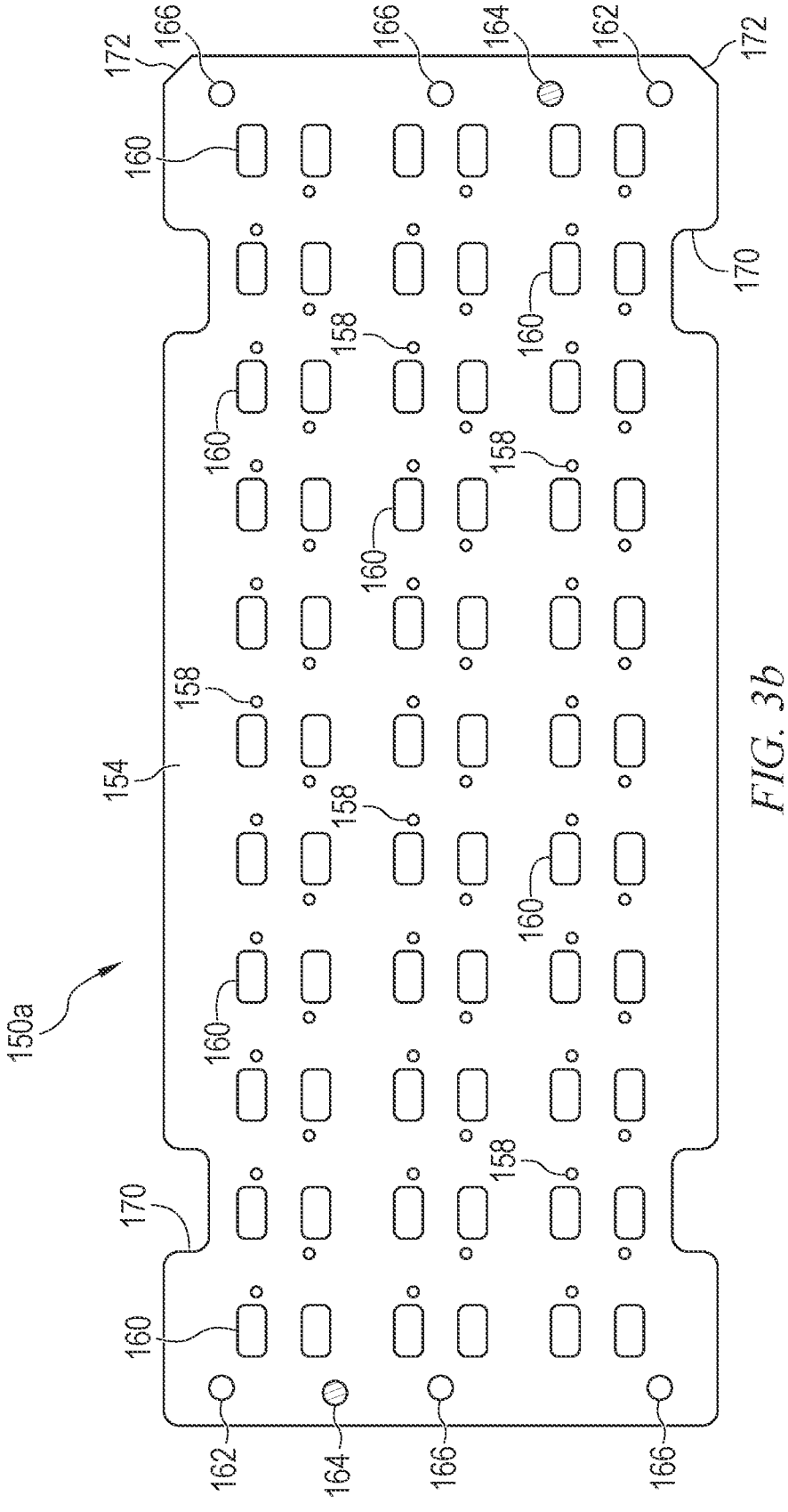
Figures 3C, 3D:
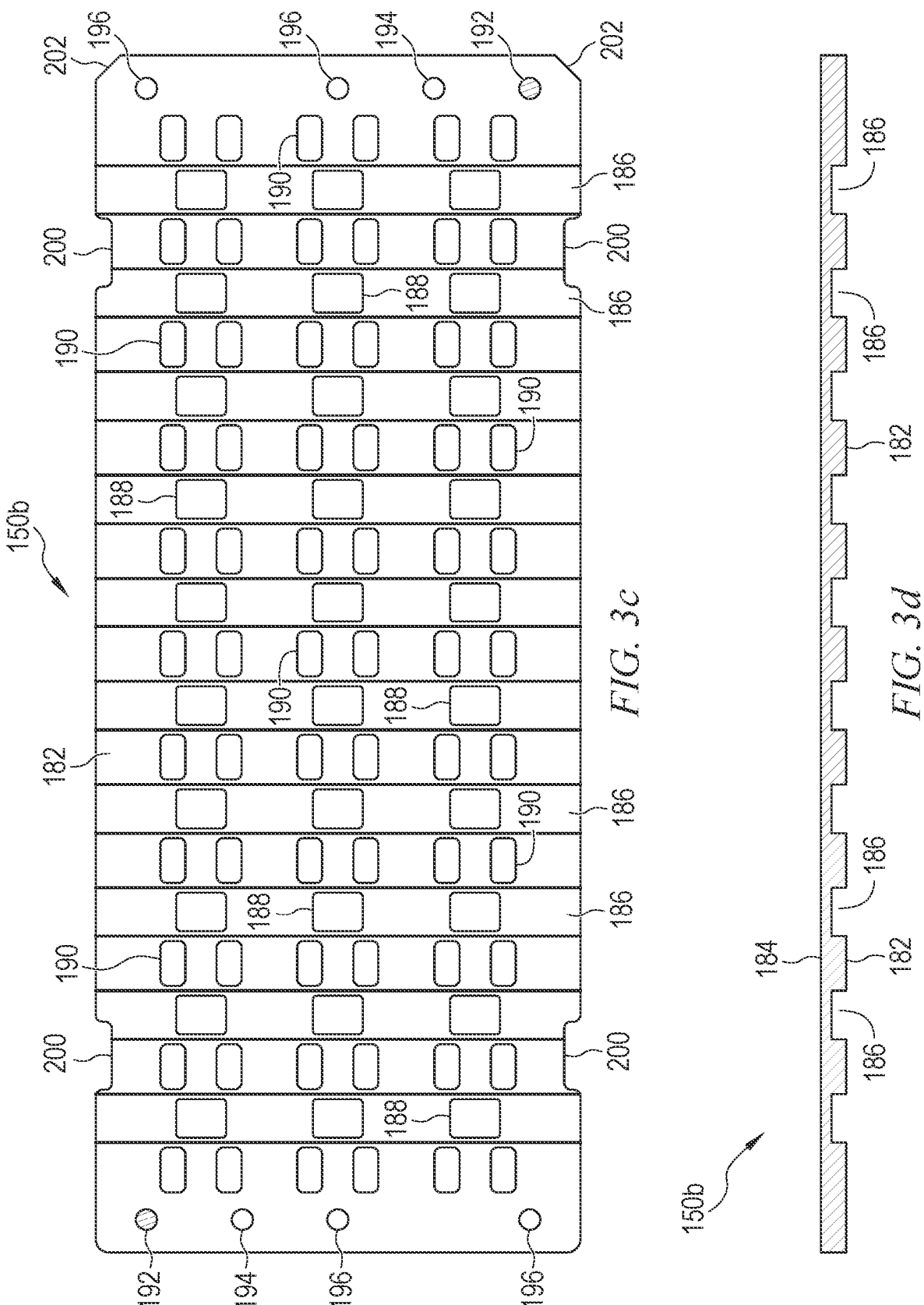
Figure 3E:
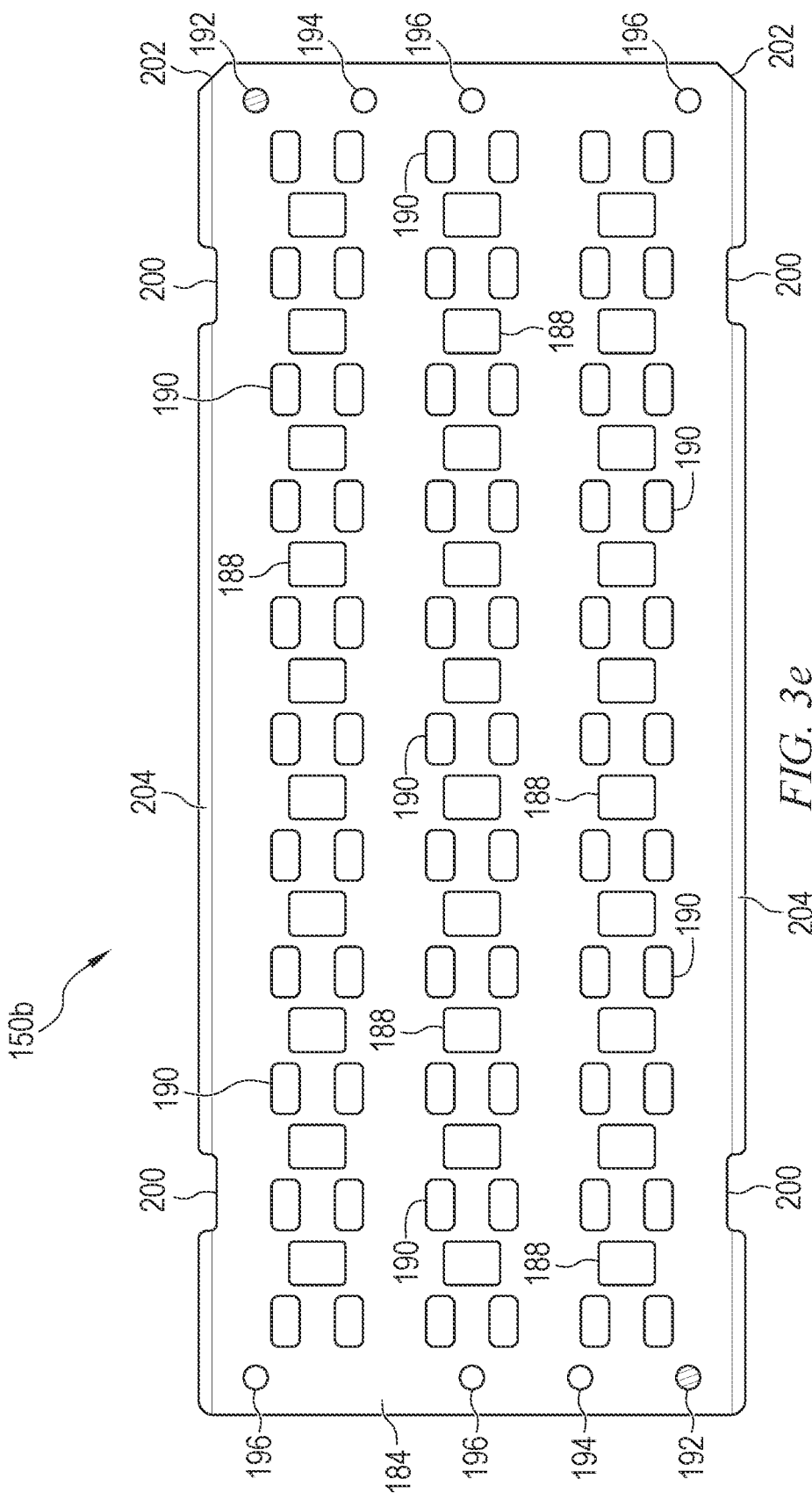

FIGS. 3a-3e illustrate a tray configured to hold singulated packages 140 for further processing. The tray is formed from a pair of metal plates 150a and 150b. FIGS. 3a and 3b show bottom plate 150a and FIGS. 3c-3e show top plate 150b. FIG. 3a is a plan view of a top or inner surface 152 of bottom plate 150a. The term inner surface refers to the way that, when bottom plate 150a and top plate 150b are combined, inner surface 152 is oriented into the combination, i.e., toward the top plate. FIG. 3b is a plan view of a bottom or outer surface 154 of bottom plate 150a. The term outer surface refers to the way that, when bottom plate 150a and top plate 150b are combined, outer surface 154 is oriented out of the combination, i.e., away from the top plate. Plates 150 are formed from sheet metal, e.g., aluminum, copper, or stainless steel, cut into the desired shape by, e.g., laser cutting, milling, or stamping. In one embodiment, a thickness of the sheet metal is 1.5 millimeters (mm), which helps to reduce warping during processing. Warping will detrimentally affect durability of handling of plates 150a and 150b during subsequent processing.

Inner surface 152 of bottom plate 150a is the surface that packages 140 will be disposed on. A plurality of markers or lines 156 are formed on surface 152 to define device rows or columns 157 for packages 140 to be placed onto. Lines 156 are formed by laser engraving, etching, or another suitable process. Other types of markers are used in other embodiments. An adhesive tape will be disposed onto each device column 157 to hold packages 140 in place. Lines 156 help align the tape on surface 152.

Each device column 157 includes apertures or openings 158 at each location that a package 140 will be placed on surface 152. For each location for a package 140 to be processed, two openings 158 are formed at two opposing corners of where the package will be placed. Openings 158 are disposed under packages 140 during processing and allow a tool to be disposed through plate 150a to demount the packages. Openings 158 are relatively small, e.g., 1 mm or smaller, being just large enough for a small dowel or rod to extend through bottom plate 150a and press up on a package 140.

Openings or apertures 160 are formed between device columns 157, at the corners of where packages 140 will be placed, such that each package 140 will have four adjacent openings 160, one at each corner of the package. Openings 160 are larger than openings 158 and can be made as large as possible without interfering with the structural integrity of bottom plate 150a and the bottom plate's ability to support packages 140. Openings 160 are formed to allow deionized (DI) water and other fluids used to process packages 140 to drain through bottom plate 150a quickly and easily. Additional or larger openings 160 can be formed, e.g., openings 160 can also be formed within device columns 157 between packages 140 to increase capacity to drain fluids.

Two opposing corners of plate 150a each include an alignment aperture 162 and an alignment peg 164. Alignment aperture 162 is an opening formed through bottom plate 150a. Alignment peg 164 is a cylindrical piece of metal press fit into an opening of bottom plate 150a. Alignment peg 164 extends above inner surface 152 and is coplanar to or recessed within outer surface 154. Top plate 150b includes corresponding alignment apertures to accept alignment peg 164 and an alignment peg configured to extend into alignment apertures 162.

Alignment apertures 166 are also formed at the ends of plate 150a. Top plate 150b has corresponding alignment apertures so that the apertures in combination extend completely through both plates together. Alignment apertures 166 are configured to allow processing equipment to align and orient plates 150a and 150b. Different equipment has different alignment pin configurations, so alignment apertures 166 can be reconfigured as necessary for the specific equipment being used. Multiple alignment apertures 166 can be formed to allow plates 150a and 150b to be compatible with a variety of processing equipment.

A plurality of engagement mechanisms 168 are embedded in or disposed on plate 150a. In one embodiment, engagement mechanisms 168 are small puck-shaped magnets press fit into openings or cavities of bottom plate 150a. The cavities for engagement mechanisms 168 optionally do not extend completely through bottom plate 150a so the magnets are not visible from outer surface 154 in FIG. 3b. The magnets of engagement mechanisms 168 apply a force to the top plate 150b when placed in proximity to the top plate, thus holding the two plates together. Magnets can be embedded in top plate 150b instead of or in addition to engagement mechanisms 168. Other types of engagement mechanisms are used in other embodiments to hold plates 150a and 150b together.

Recesses 170 are formed as indentations along the longer edges of bottom plate 150a. Recesses 170 allow a place for top plate 150b to be removed from bottom plate 150a from the inner surface of the top plate without the bottom plate interfering. Top plate 150b will be exposed from the bottom of the combination within recesses 170.

One or more corners of plate 150a are chamfered to form orientation markers or identifiers 172. Orientation markers 172 allow equipment to identify the desired orientation of plate 150a. Other types of orientation markers 172 can be used in other embodiments, e.g., a fiducial marker formed or disposed on inner surface 152 or outer surface 154.

FIGS. 3c-3e show details of top plate 150b. FIG. 3c is a plan view of inner or bottom surface 182. Inner surface 182 is oriented into the combination when plates 150a and 150b are combined. FIG. 3d is a cross-sectional view. FIG. 3e is a plan view of outer or top surface 184. Outer surface 184 is oriented out of the combination when plates 150a and 150b are combined.

Trenches 186 are formed into inner surface 182 at positions aligned to device columns 157 of bottom plate 150a. Trenches 186 are formed by, e.g., milling, across an entire width of top plate 150b to reduce a thickness of the top plate. Reducing the thickness of top plate 150b along the stripes where packages 140 will be placed on bottom plate 150a allows the height of the top surface of the packages to be customized by increasing or reducing a thickness of tape used to mount the package. A tape with a customized thickness can be used on device columns 157 of bottom plate 150a while still allowing inner surface 182 of top plate 150b to directly physically contact inner surface 152 of the bottom plate.

Device apertures or openings 188 are formed through top plate 150b within trenches 186 aligning to positions where packages 140 are to be disposed on bottom plate 150a. The size and shape of device openings 188 match the footprint of packages 140 with the openings being slightly larger than the packages by, e.g., one micrometer or less of space between the outer surfaces of the packages and the inner surface of the openings. Having micron or sub-micron spacing between packages 140 and the edges of openings 188 allows the openings to keep the packages positioned properly while still allowing the side surfaces to be exposed for processing.

Apertures or openings 190 are formed through top plate 150b. Openings 190 are formed with sizes, shapes, and positions matching openings 160 of bottom plate 150a so that DI water or other fluids used for processing of packages 140 can efficiently flow through both plates.

Top plate 150b has an alignment peg 192 and an alignment aperture 194 formed at each end of the top plate. Alignment peg 192 is a metal dowel or peg that is press fit into an aperture of top plate 150b. Alignment peg 192 extends over inner surface 182 and is positioned and sized to fit into alignment aperture 162 of bottom plate 150a when the two plates are combined. Alignment aperture 194 is sized and positioned to receive alignment peg 164 of bottom plate 150a in a similar manner. Alignment apertures 196 of top plate 150b are sized and positioned to match alignment apertures 166 of bottom plate 150a so that, in combination, the alignment apertures 166 and 196 form alignment apertures extending continuously through both plates.

Recesses 200 are formed along edges of top plate 150b at positions that align with recesses 170 of bottom plate 150a. Recesses 200 are not strictly necessary for recesses 170 to serve their function. The purpose of recesses 200 on top plate 150b is to highlight the positions of recesses 170 on bottom plate 150a, which would otherwise be totally hidden in plan view.

One or more corners of top plate 150b are chamfered to form orientation markers or identifiers 202. Orientation markers 202 allows equipment to identify the desired orientation of top plate 150b. Other types of orientation markers 202 can be used in other embodiments, e.g., a fiducial marker formed or disposed on inner surface 182 or outer surface 184. In one embodiment, orientation markers 202 are chamfered corners matching orientation markers 172 so that the combination of plates 150a and 150b has chamfered corners for its entire thickness to operate as orientation markers for the combination. Outer surface 184 has chamfers 204 formed along the two longer edges to improve ergonomics or to fit in the equipment being used to process packages 140. All four edges can be chamfered in other embodiments.

Figures 4A, 4B:
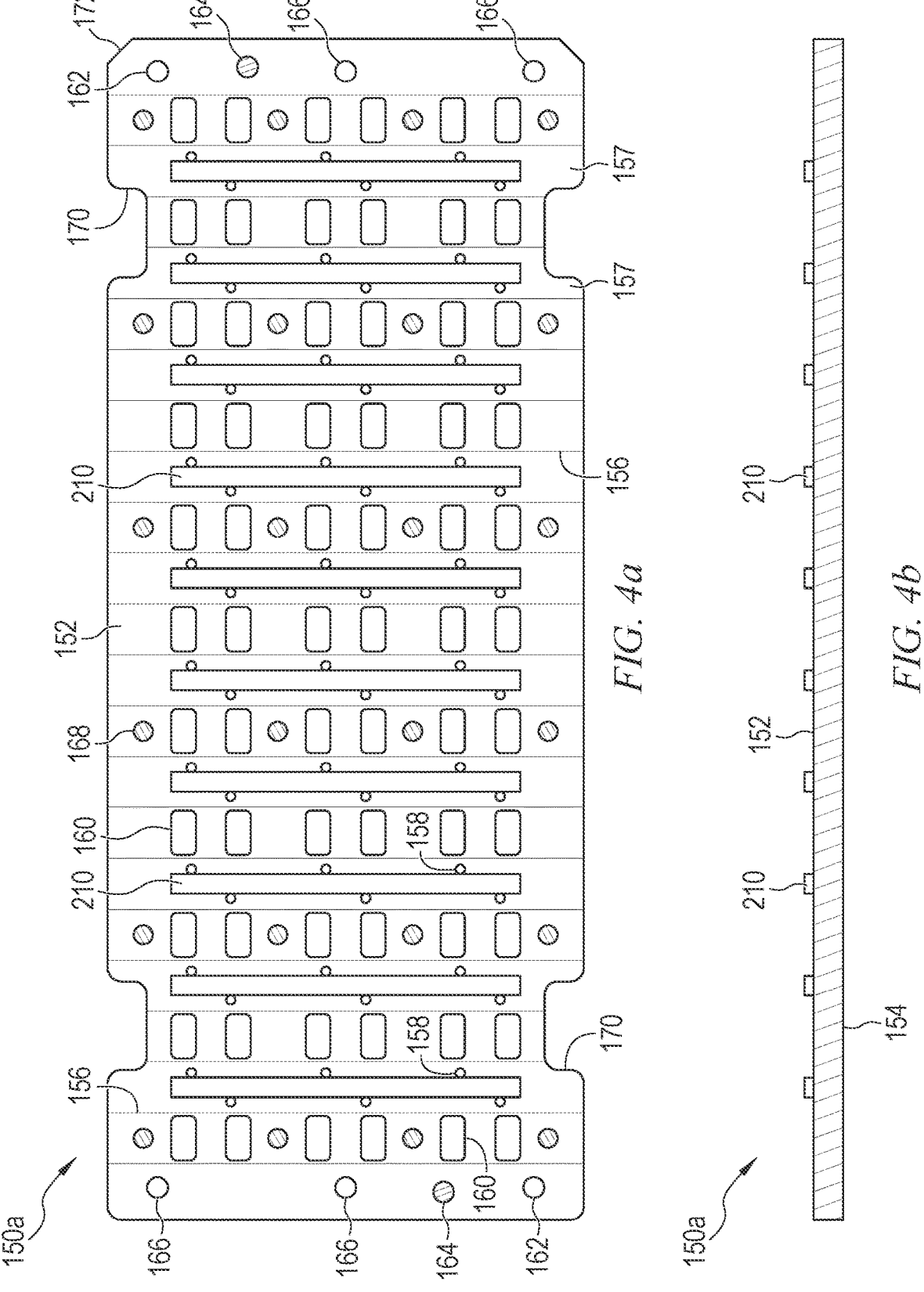
FIGS. 4a-4i illustrate usage of the semiconductor package carrier.

FIGS. 4a-4i illustrate processing packages 140 using plates 150a and 150b in combination as a carrier. In FIGS. 4a and 4b, a piece of tape 210 is applied on inner surface 152 of bottom plate 150a along each device column 157. Tape 210 is, e.g., a silicon resin or other polymer film coated with adhesive to stick to bottom plate 150a. Tape 210 can have double-sided adhesive to adhere both to bottom plate 150a and also to packages 140. In another embodiment, adhesive is applied to bottom plate 150a and tape 210 only has adhesive for sticking to packages 140. Tape 210 is a tascil tape in one embodiment.

Lines 156 help the machine applying tape 210 to align the tape to device columns 157. Tape 210 has a width that is less than the lateral distance between openings 158 so that the tape does not overlap openings 158. Leaving openings 158 exposed helps keep tape 210 from interfering when packages 140 are removed. However, tape 210 can cover openings 158 in other embodiments. FIG. 4b shows that tape 210 has a thickness over inner surface 152. A thickness of tape 210 can be changed to control a height of packages 140 over bottom plate 150*a* when the packages are disposed on the tape.

Figures 4C, 4E:
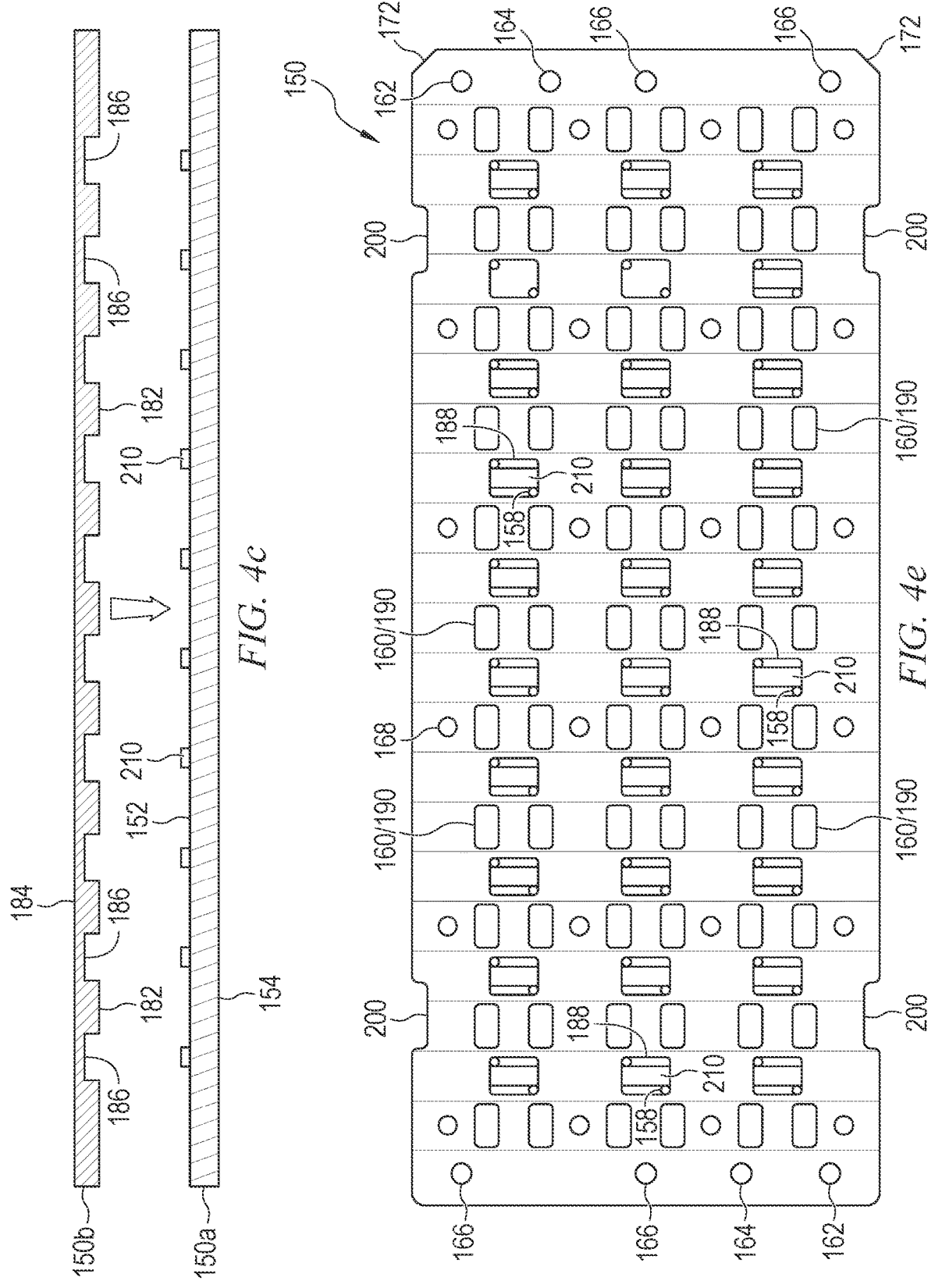
Figures 4D, 4F:
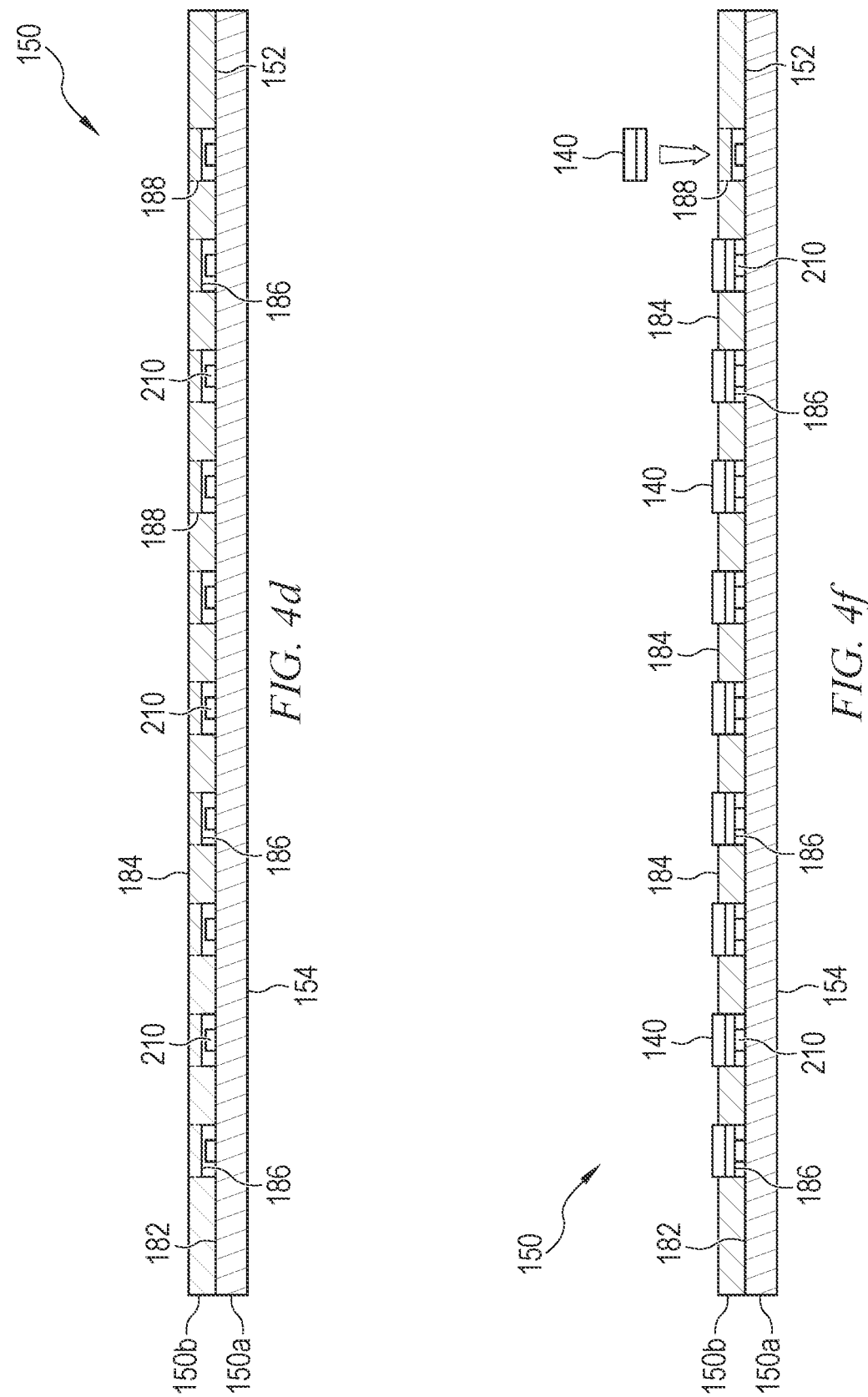

In FIG. 4*c*, top plate 150*b* is disposed over bottom plate 150*a* and lowered onto the bottom plate to form, in combination, a carrier 150 in FIG. 4*d*. FIG. 4*e* shows a plan view of carrier 150 with bottom plate 150*a* and top plate 150*b* combined. Inner surfaces 152 and 182 directly physically contact each other. Trenches 186 provide space for tape 210 to lie without creating a gap between inner surfaces 152 and 182. Tape 210 is visible through openings 188 of top plate 150*b*.

In FIG. 4*f*, packages 140 are disposed through openings 188 onto tape 210 using a pick-and-place machine or operation. The top surface of packages 140 extends slightly proud, or above, outer surface 184 of top plate 150*b*. Having package 140 taller than outer surface 184 is not necessary but improves process efficiency. Tape 210 has an adhesive that bonds packages 140 to bottom plate 150*a*. A slight gap, not visible in the figures, exists between the outer side surfaces of packages 140 and the inner side surfaces within openings 188.

Figures 4G, 4H:
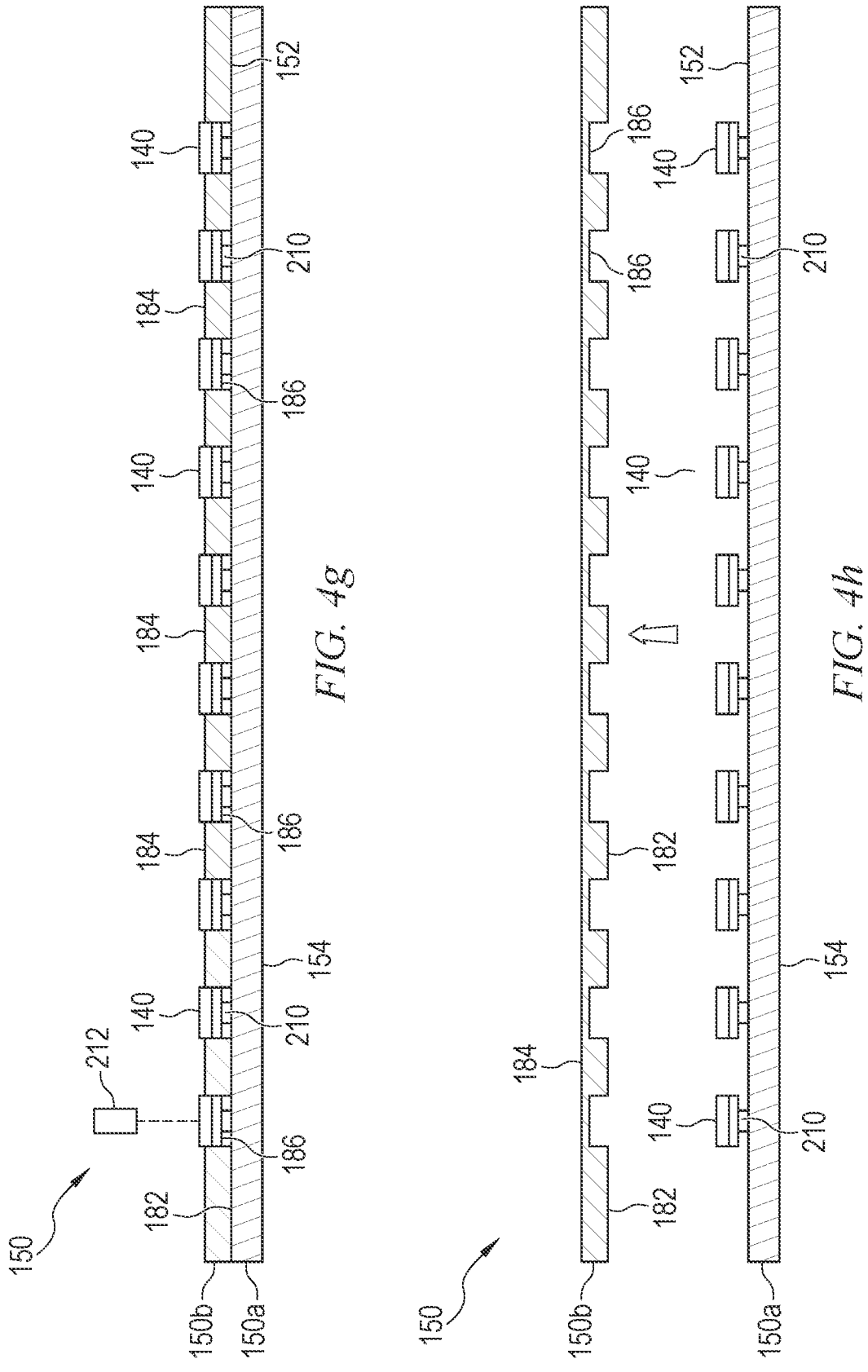
Figure 4I:
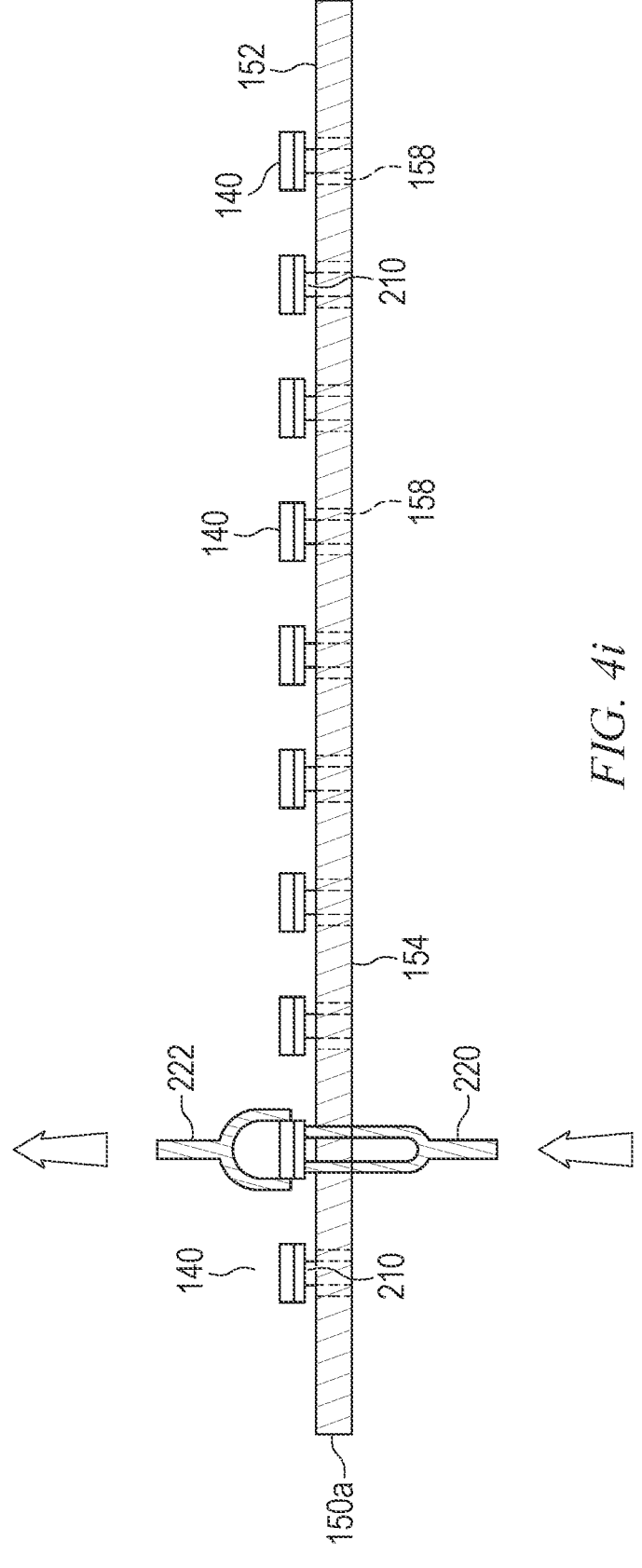

In FIG. 4*g*, packages 140 are processed while being supported by carrier 150. The processing is represented by a laser 212 ablating or etching packages 140. The processing can also include washing packages 140 with DI water, sputtering a conductive layer for shielding, or any other desired manufacturing process.

After processing is completed, top plate 150*b* is removed in FIG. 4*h*. The removal of top plate 150*b* leaves packages 140 sitting above inner surface 152 of bottom plate 150*a* on tape 210. Packages 140 are removed in FIG. 4*i* by inserting a tool 220 into openings 158. Tool 220 has a pair of rods that are configured to be inserted into two adjacent openings 158 and allow the tool to press upward on the bottom of a surface of a package 140, thus separating the package from the tape and bottom plate 150*a*. A pick and place machine 222 grabs onto package 140 from the top to move the completed package to a tape and reel or other suitable storage for delivery.

Carrier 150, formed from metal plates 150*a* and 150*b*, is suitable to support and secure singulated semiconductor packages of any type in fixed position for precision during the manufacturing process. The packages can be leadless or leaded, formed with a PCB substrate or a leadframe, have a land-grid array, side solderable contacts, solder bumps, or pins, etc. Carrier 150 supports precision positioning of semiconductor packages to improve process efficiency for improved reliability in the resulting packages. Forming carrier 150 from metal allows the carrier to be used in processing steps requiring high temperature, which can often reach 260 degrees Celsius.

Carrier 150 includes a cavity formed by opening 188 to receive each singulated device. Tape 210 holds the packages in the cavity. Tape 210 can be reused multiple times with multiple sets of packages, but should be replaced once sufficient adhesion is not provided, e.g., every five uses. Having carrier 150 formed from two separable plates makes the package removal process easier, while still allowing sufficient support for the package during processing. While carrier 150 is shown as holding ten columns and three rows of packages, the carrier can be resized and reconfigured to hold any reasonable number of units.

Figure 5A:
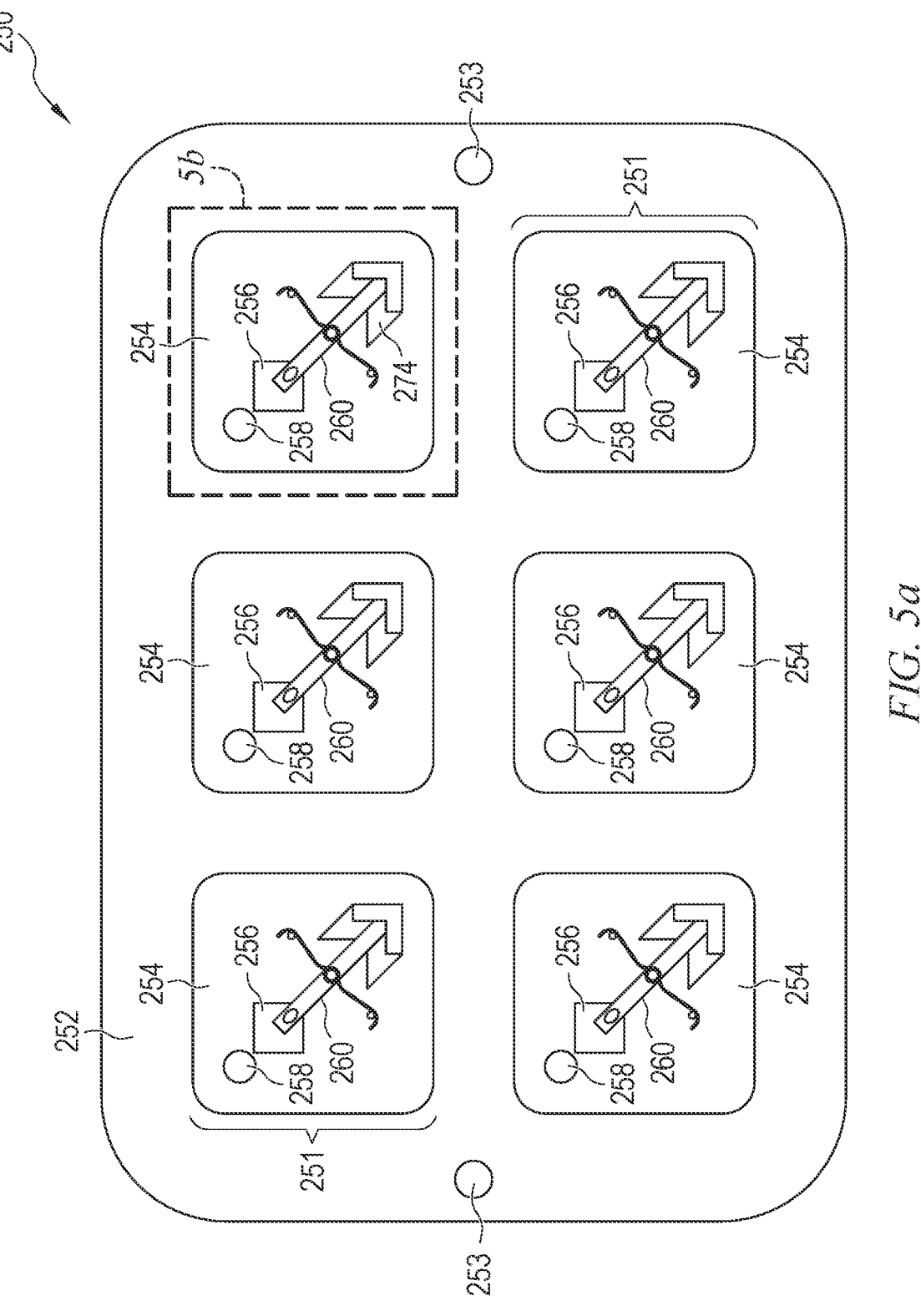
FIGS. 5a-5g illustrate a carrier for aperture substrates.

FIGS. 5*a*-5*g* illustrate a carrier 250 for holding and processing aperture substrates. Aperture substrates are substrates used to form semiconductor packages that have apertures, e.g., an opening formed completely through the substrate or a cavity formed partially through the substrate. FIG. 5*a* shows a plan view of carrier 250. Carrier 250 includes a plurality of substrate positioning areas 251, each configured to hold an individual singulated aperture substrate. While six positioning areas 251 are illustrated, a carrier 250 can easily be formed larger to hold more substrates by replicating positioning area 251 additional times across a larger substrate.

Carrier 250 is formed from a flat plate of a metallic or other rigid material, e.g., aluminum, copper, stainless steel, or a polymer. A top surface 252 of carrier 250 has a receptacle 254 formed into the top surface for each positioning area 251. Receptacle 254 is recessed into top surface 252 of carrier 250 by CNC milling, chemical etching, or another suitable means. A smaller opening 256 is formed completely through carrier 250 for each positioning area 251 within its respective receptacle 254. In one embodiment, receptacles 254 are formed by half etching from top surface 252 and opening 256 is formed by half-etching from the opposite surface. Openings 256 can also be formed by milling. Two alignment openings 253 are formed through carrier 250, one at each end of the carrier.

Each positioning area 251 has a static datum 258 and a movable datum 260. Static datum 258 is a peg or dowel press fit into carrier 250 within receptacle 258. In another embodiment, static datum 258 is a pillar of the carrier 250 material remaining after etching receptacle 254 to surround the static datum. Movable datum 260 is slidably coupled to carrier 250 within receptacle 254. An arrow-shaped slot 274 is formed into carrier 250 within receptacle 254 to hold movable datum 260 and allow the movable datum to slide. Movable datum 260 is slidable along a linear path so that the movable datum can be slid toward and away from static datum 258.

Movable datum 260 is spring-loaded so that the movable datum automatically returns to a position furthest away from static datum 258, which is the position shown in FIG. 5*a*. To securely hold an aperture substrate, movable datum 260 is slid toward static datum 258 so that both datums fit within the aperture of the substrate. The substrate is disposed with static datum 258 and movable datum 260 within its aperture, then the movable datum is released to spring away from the static datum. Movable datum 260 applies a force against inner surface of the aperture substrate's aperture due to the spring-loaded nature of the movable datum. The force applied by movable datum 260 also presses the opposite side of the aperture against static datum 258 to provide two points of friction holding the substrate within receptacle 254.

Figure 5B:
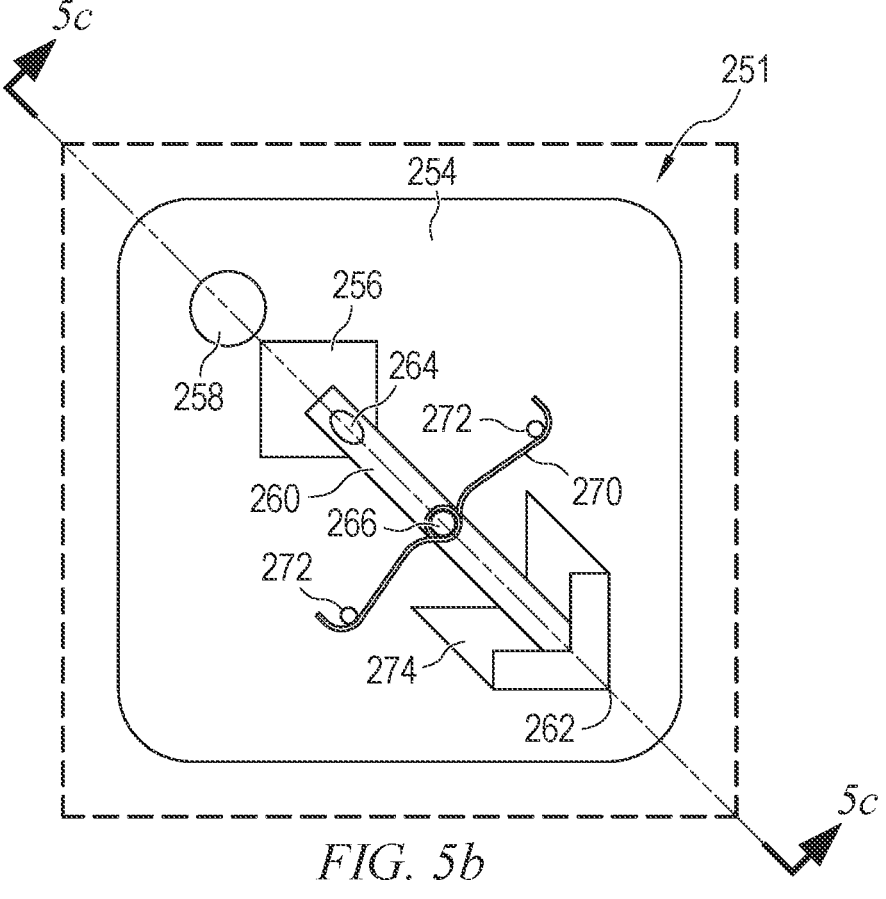
Figure 5C:
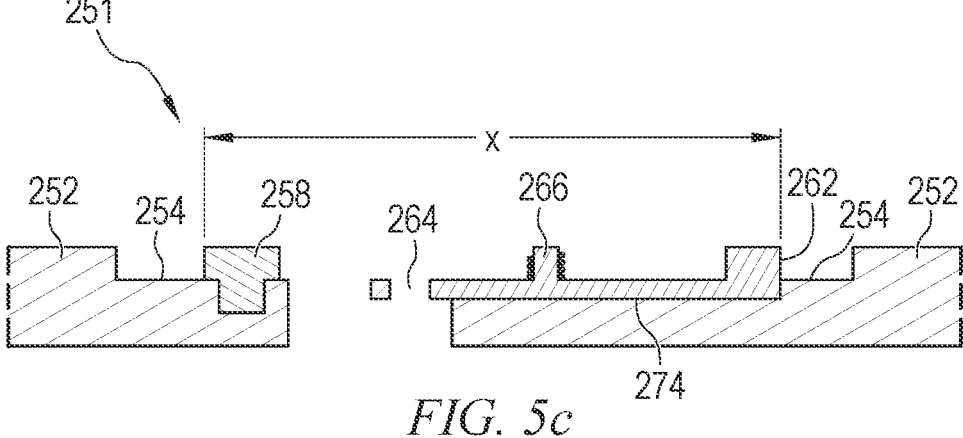
Figure 5E:
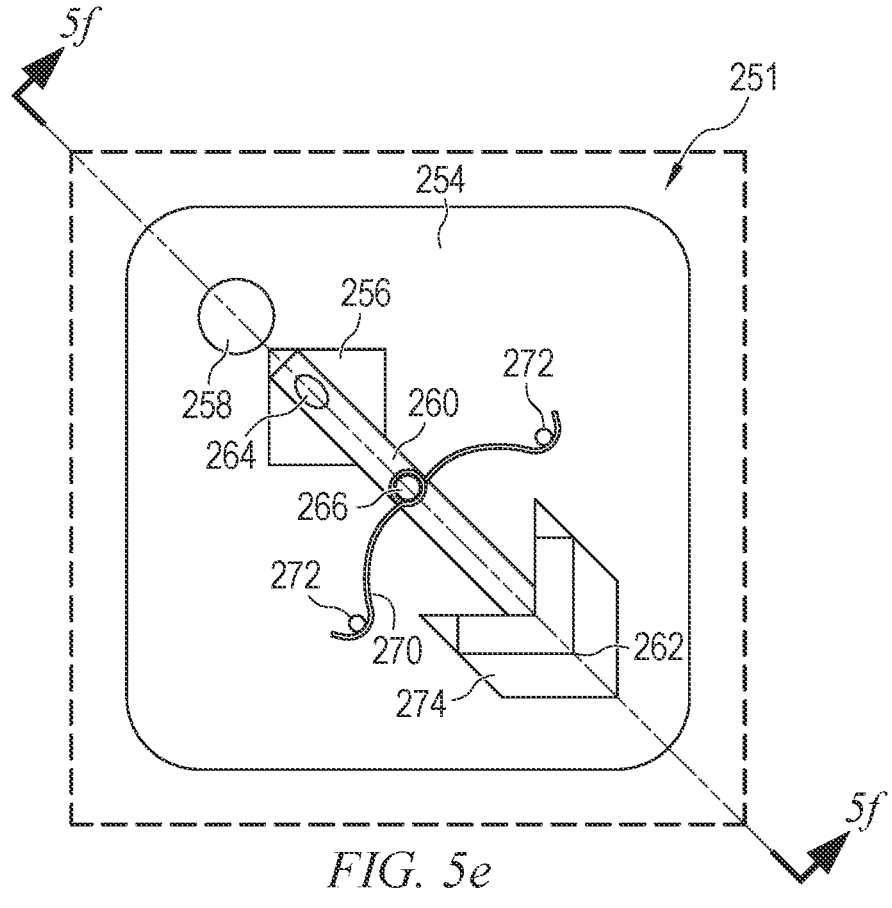
Figure 5F:
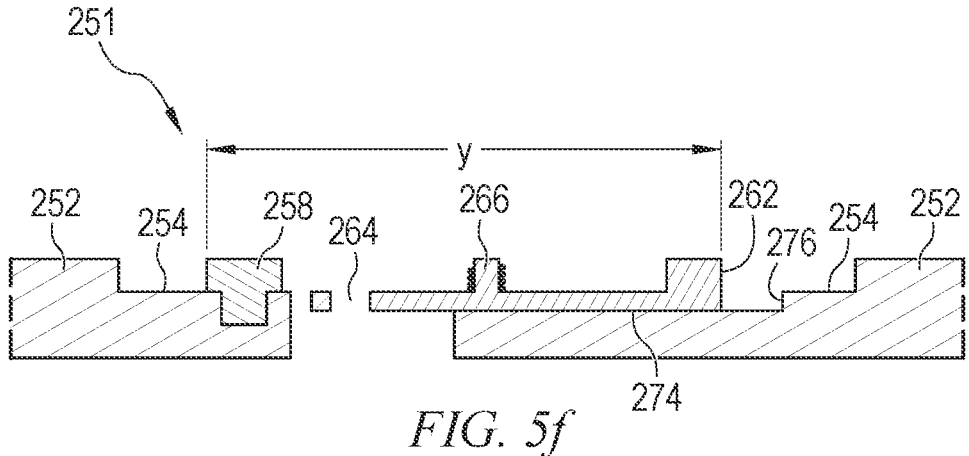
Figure 5D:
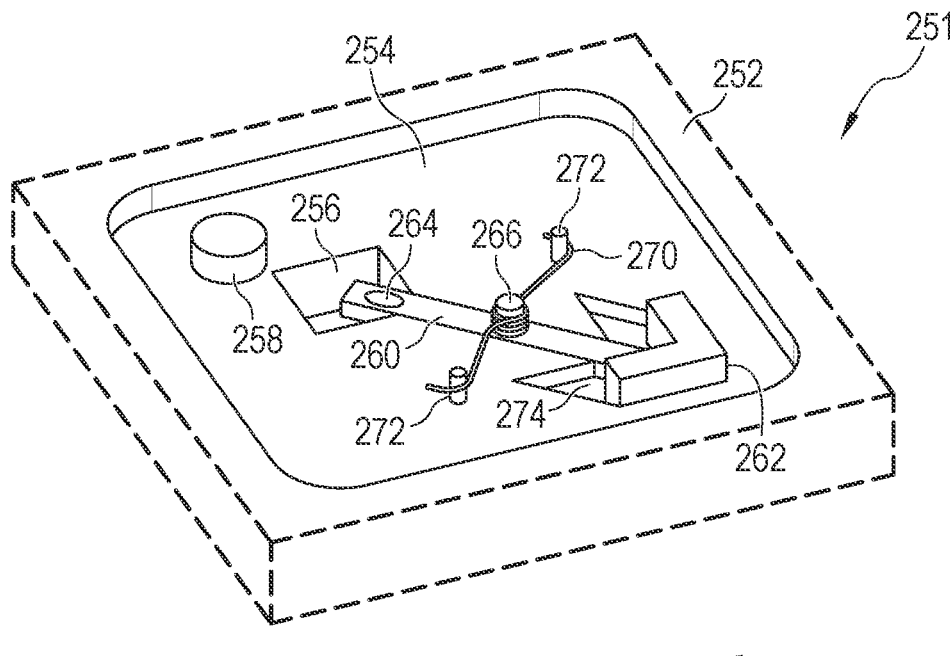

FIG. 5*b* shows an enlarged view of a single positioning area 251, while FIG. 5*c* shows a cross-sectional view and FIG. 5*d* shows a perspective view. Movable datum 260 includes a datum surface 262 oriented away from static datum 258. Datum surface 262 forms a right angle to fit securely within an internal corner of an aperture substrate. In other embodiments, datum surface 262 can have a different angle or be rounded similar to static datum 258. Static datum 258 can be square instead of round in other embodiments.

Movable datum 260 includes a recess 264 over opening 256. Recess 264 is an opening formed completely through the movable datum to allow a retractor pin to be inserted through the movable datum from the bottom of carrier 250 to actuate the movable datum. Movable datum 260 includes a spring peg 266 extending upward. Spring peg 266 is configured to hold a spring 270 on movable datum 260. Spring 270 is attached to movable datum 260 and applies a force against pegs 272, which extend upward within receptacle 254. Spring 270 applying a force against pegs 272 causes movable datum 260 to return to the position shown in FIGS. 5b and 5c if moved toward static datum 258 and then released.

Movable datum 260 sets within a slot 274 of carrier 250. Slot 274 can include features to retain movable datum 260 within the slot, or the movable datum can be retained within the slot by pressure applied by spring 270 or simply gravity. Movable datum 260 slides toward and away from static datum 258 within slot 274. In FIGS. 5b-5d, movable datum 260 is at its default position furthest away from static datum 258. A distance X, illustrated in FIG. 5c, exists between the outermost surfaces of static datum 258 and datum surface 262 of movable datum 260.

Figure 5G:
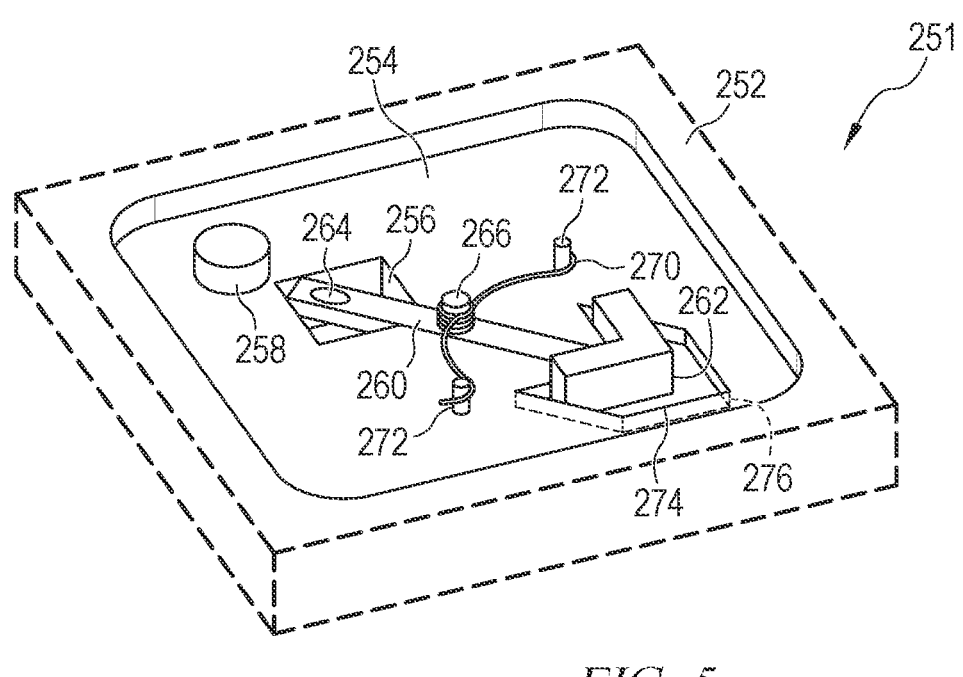

In FIG. 5e-5g, movable datum 260 is slid back toward static datum 258. FIG. 5e shows a plan view, FIG. 5f shows a cross-sectional view, and FIG. 5g shows a perspective view. Surface 276 illustrates the position of datum surface 262 in the default position from FIGS. 5b-5d. Movable datum 260 as a whole has been slid toward static datum 258. Tension is added to spring 270 because pegs 272 remain in the same position as before.

Recess 264 remains over opening 256. Opening 256 extends continuously from the position of recess 264 in the default position of movable datum 260 in FIGS. 5b-5d to the compressed position of the movable datum in FIGS. 5e-5g. The size of opening 256 allows a retractor pin to slide movable datum 260 along its entire extent without hitting carrier 250 by remaining within opening 254. When movable datum 260 is moved fully toward static datum 258, a distance Y, illustrated in FIG. 5f, exists between the outermost surfaces of static datum 258 and datum surface 262 of movable datum 260. The distance Y is less than the distance X in FIG. 5c.

When movable datum 260 and static datum 258 are compressed toward each other as shown in FIG. 5f, an aperture of a substrate can fit around both datums that was not able to when the datums are expanded as in FIG. 5c. When movable datum 260 is released within the substrate's aperture, spring 270 tries to return the movable datum to the expanded position in FIG. 5c and thereby causes both datums to apply a force against the inner surfaces of the aperture at two opposing points.

Figure 6A:
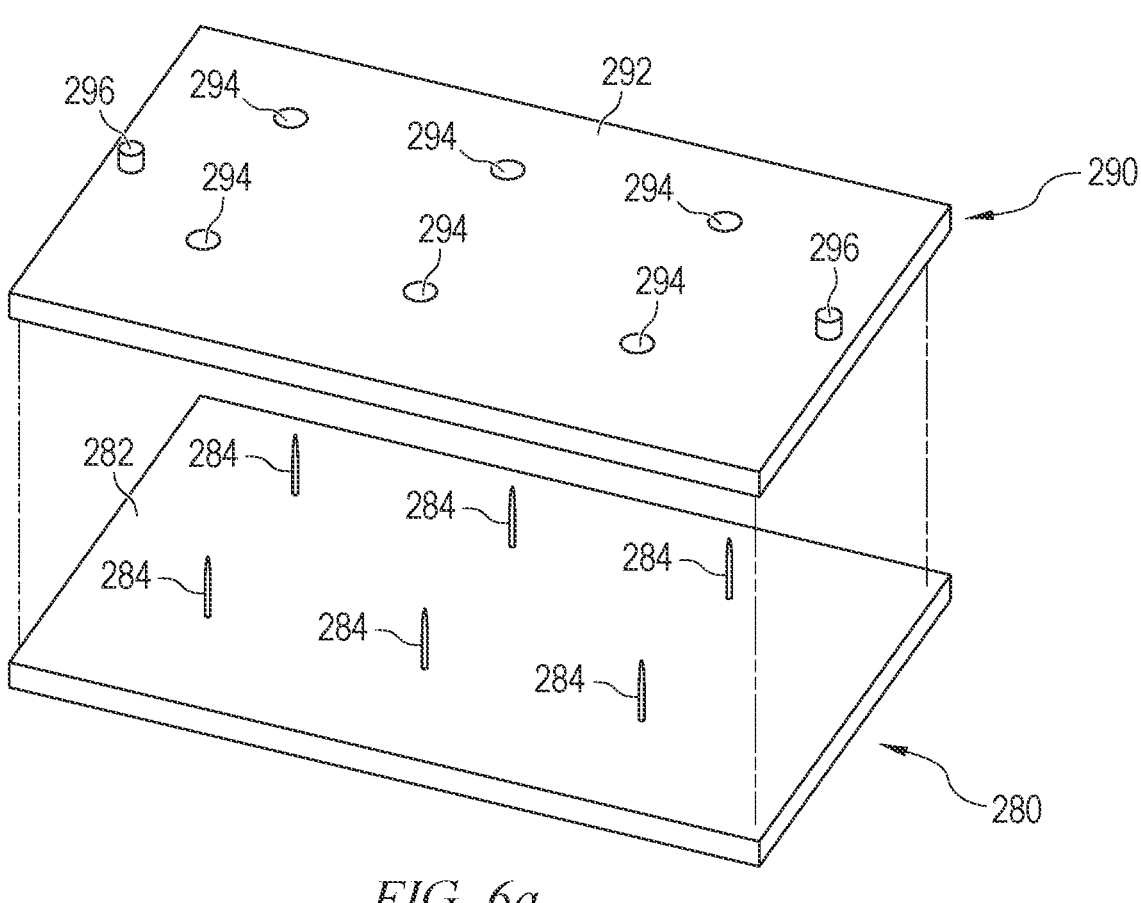
FIGS. 6a-6o illustrate usage of the aperture substrate carrier.
Figure 6B:
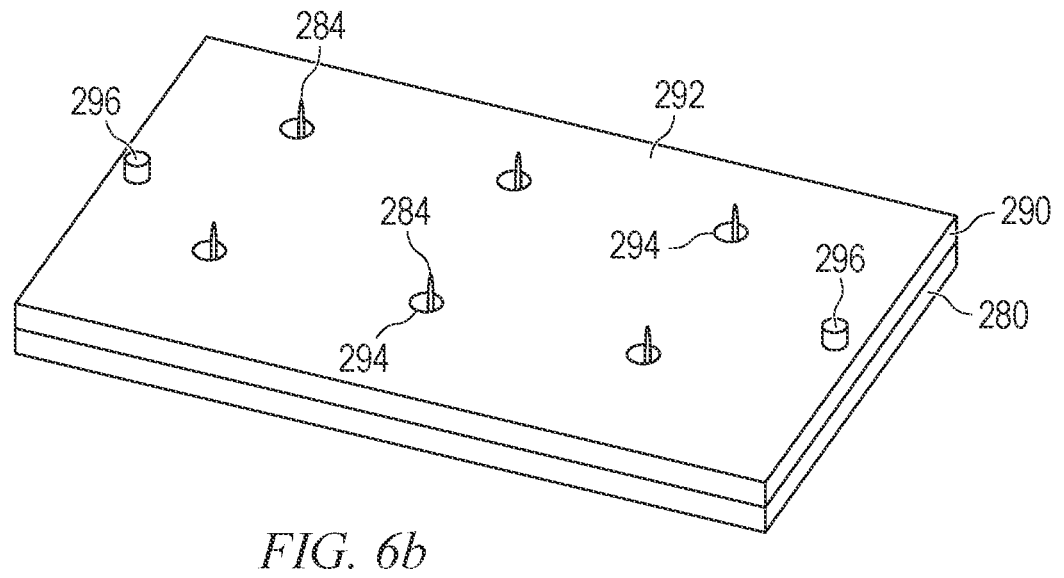
Figure 6C:
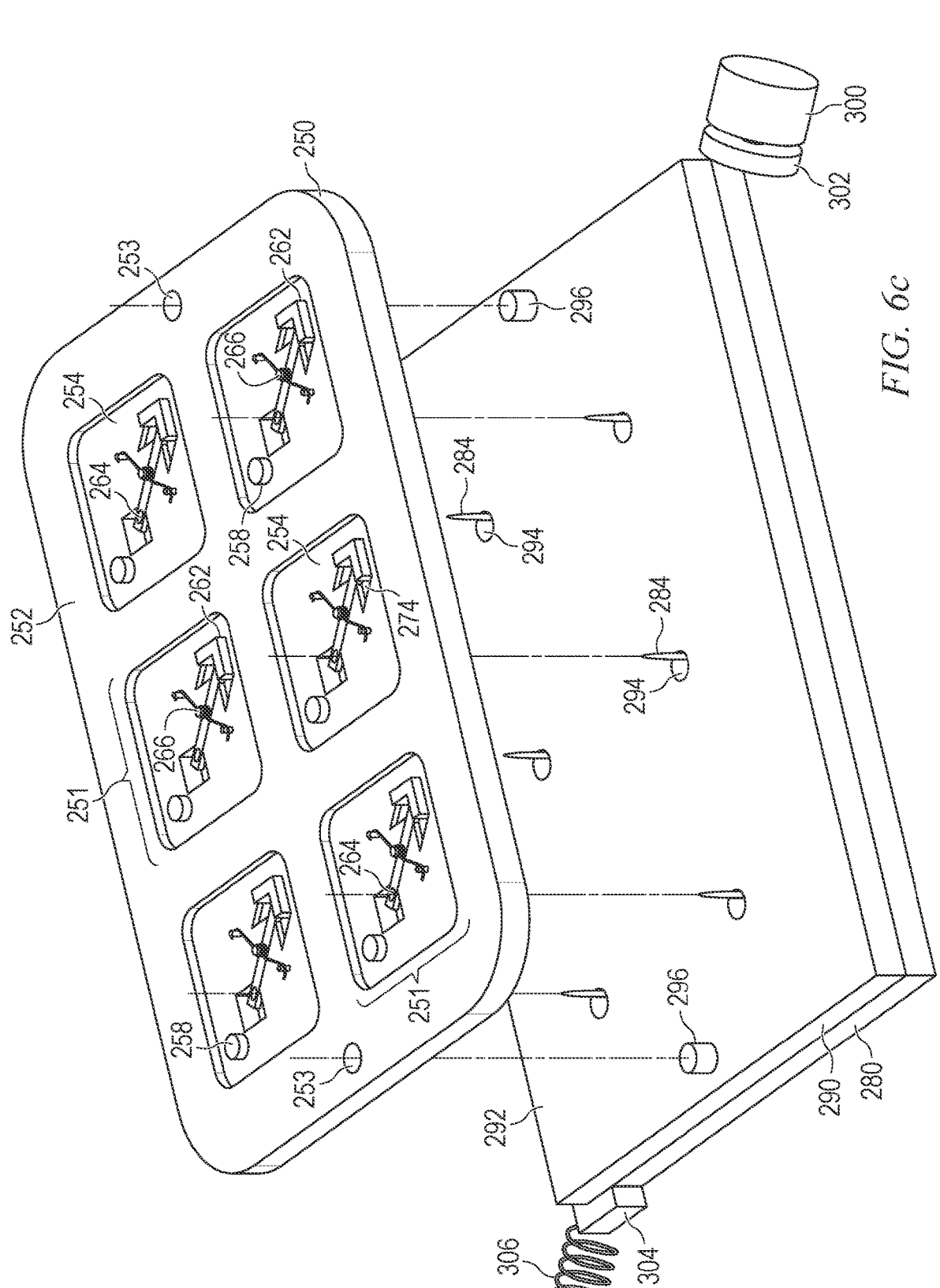
Figure 6D:
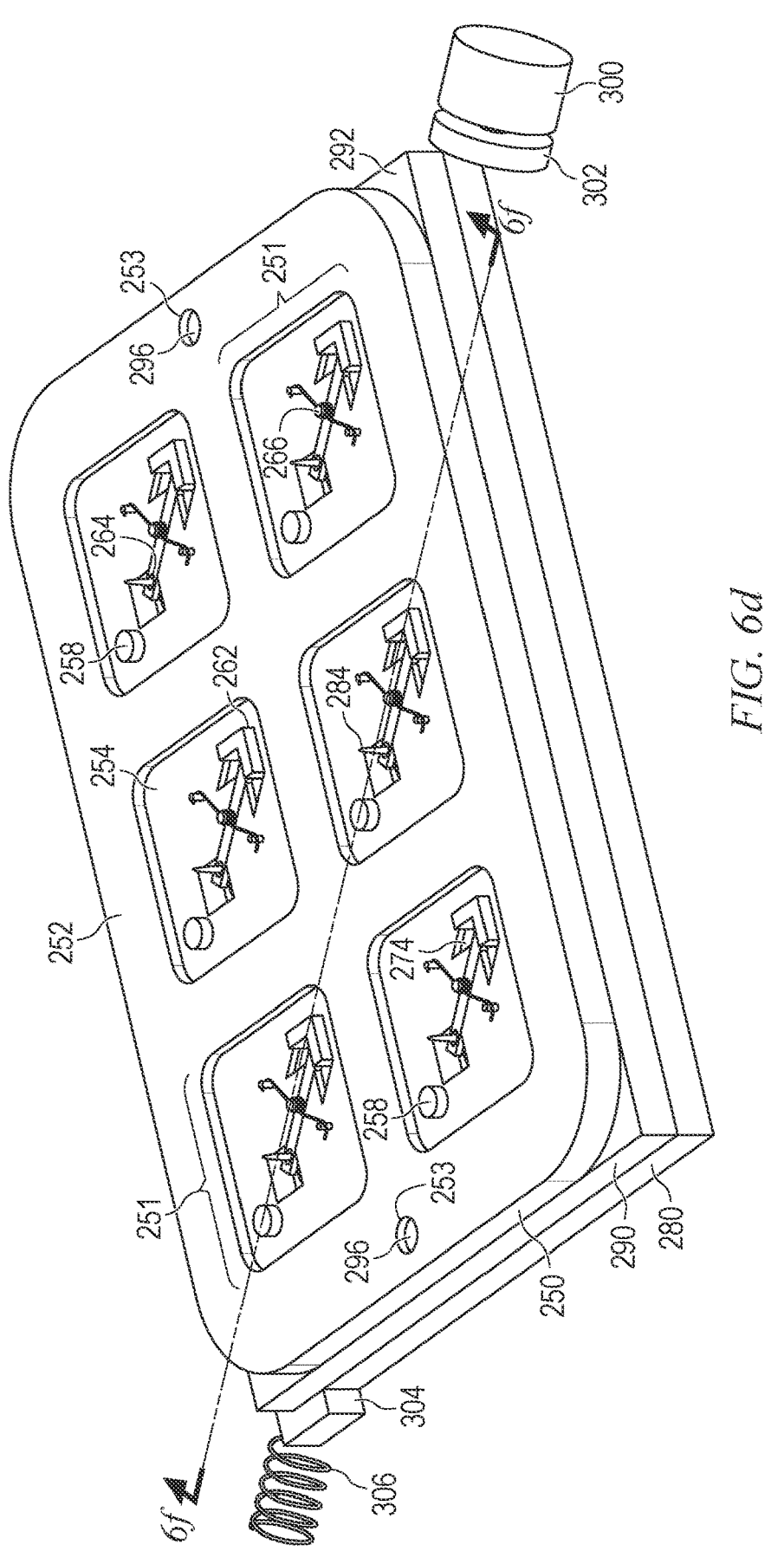
Figure 6E:
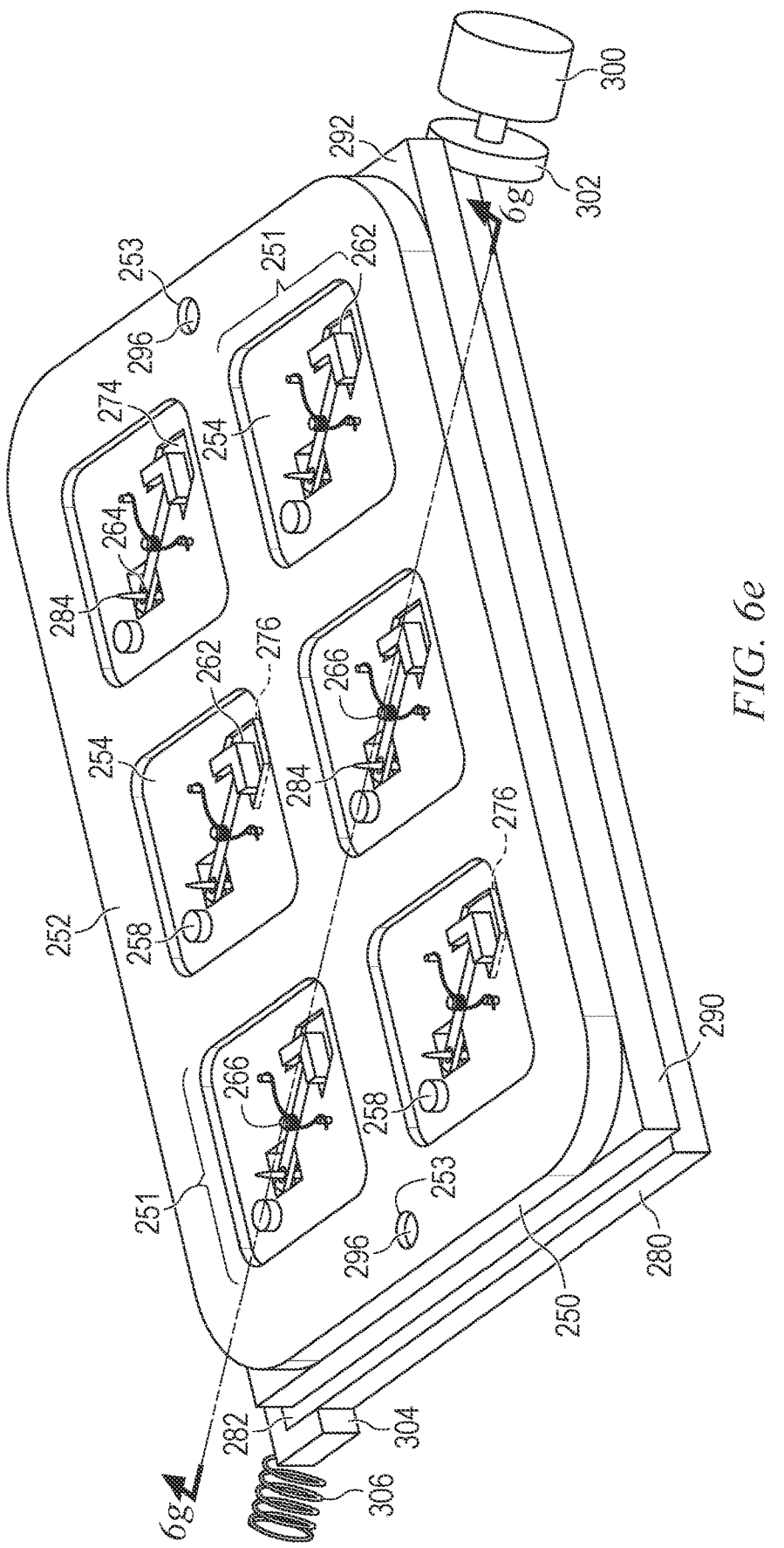
Figure 6F:
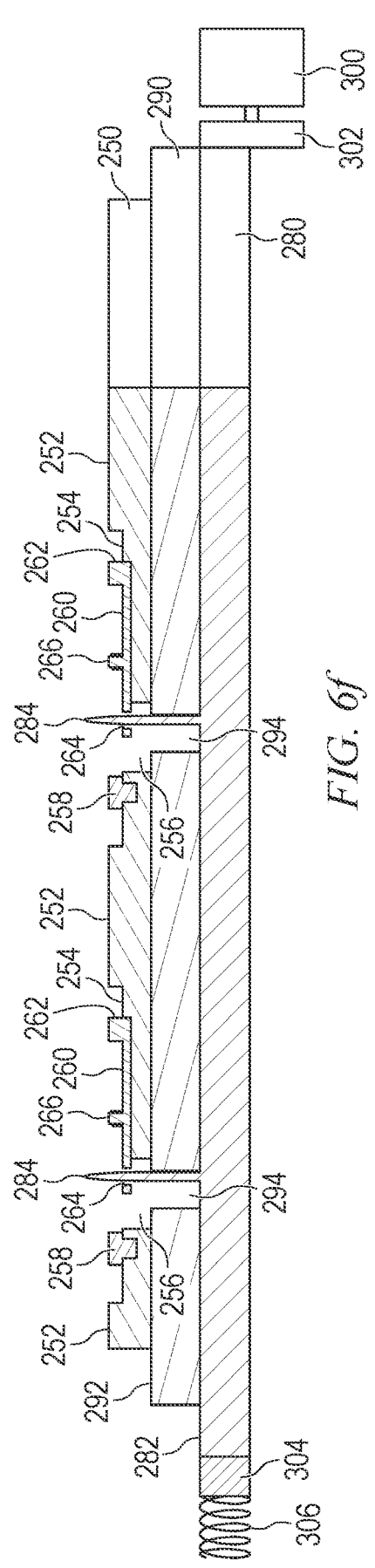
Figure 6G:
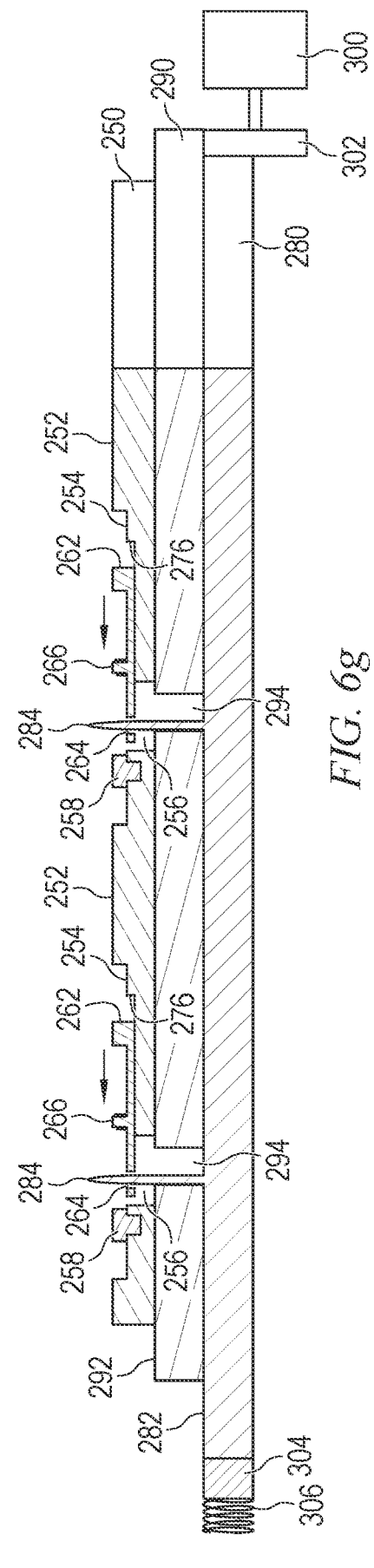
Figure 6H:
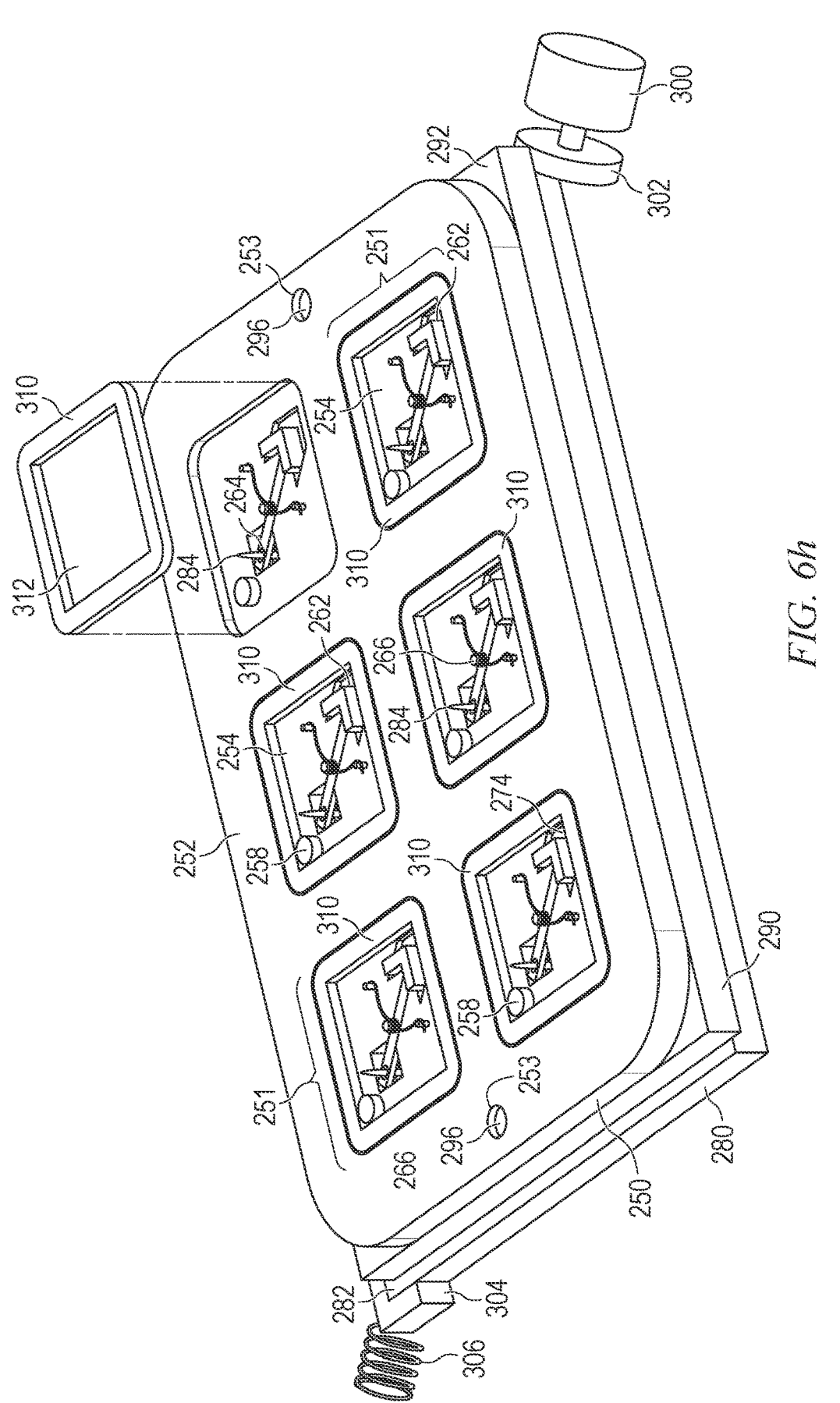
Figure 6I:
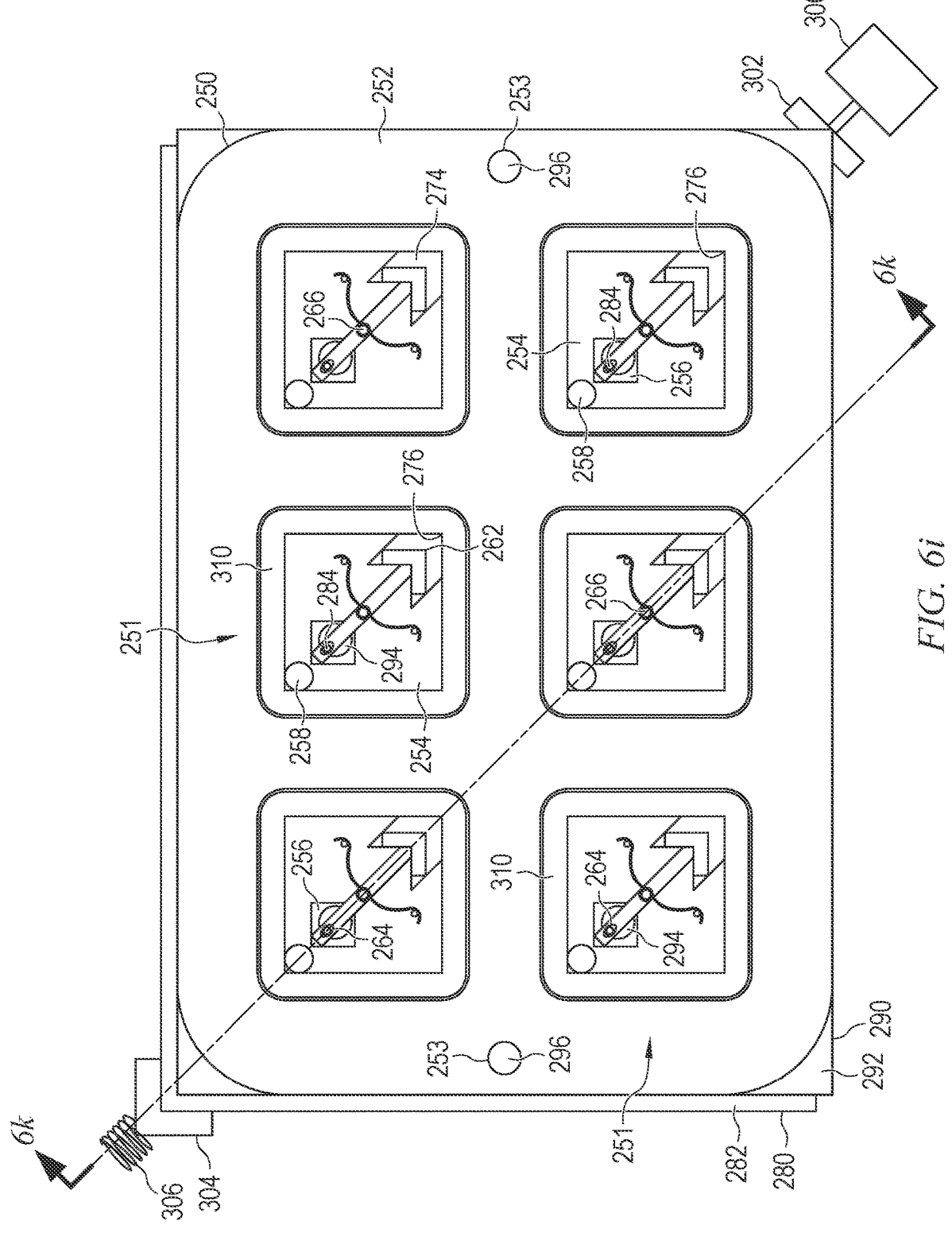
Figure 6J:
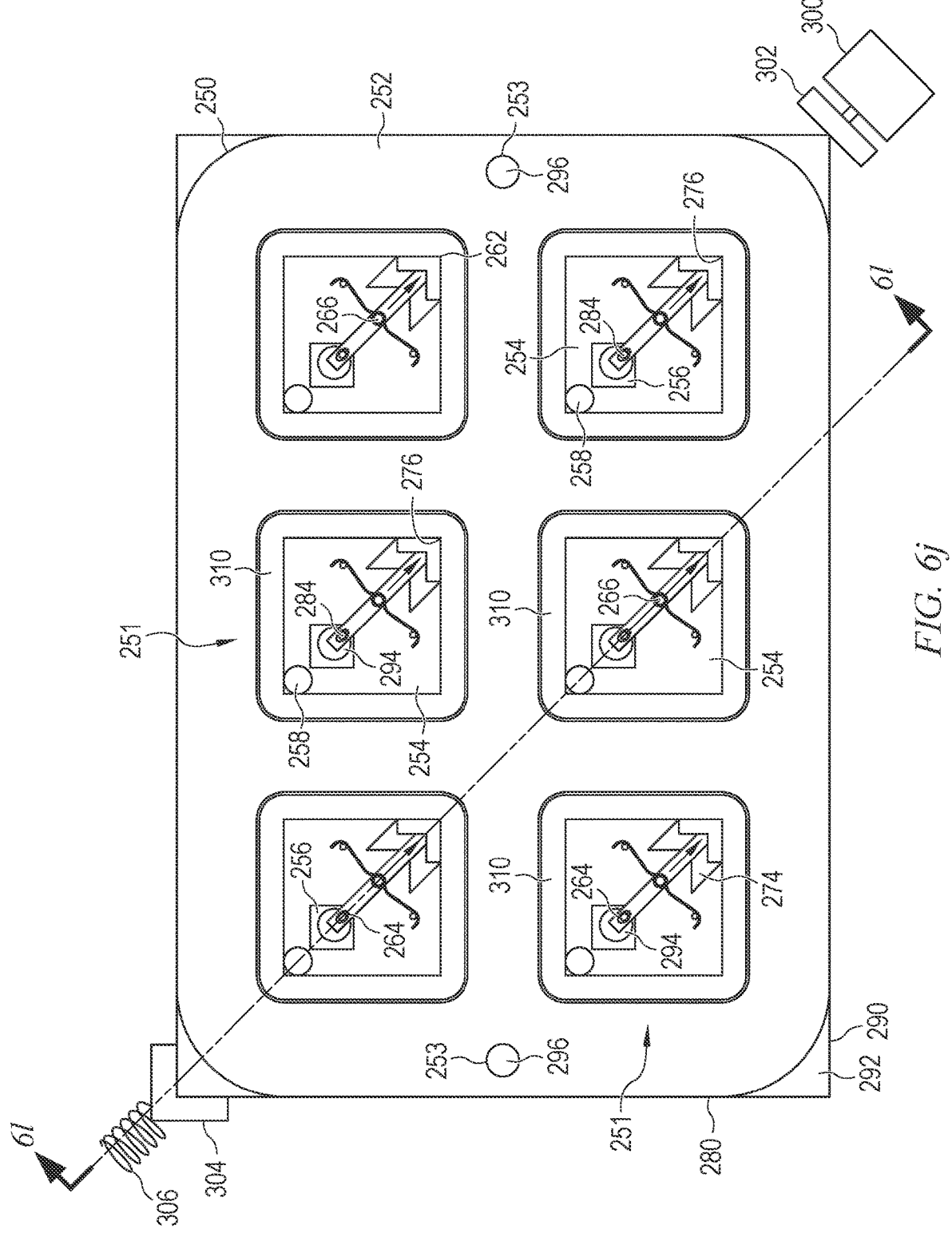
Figure 6K:
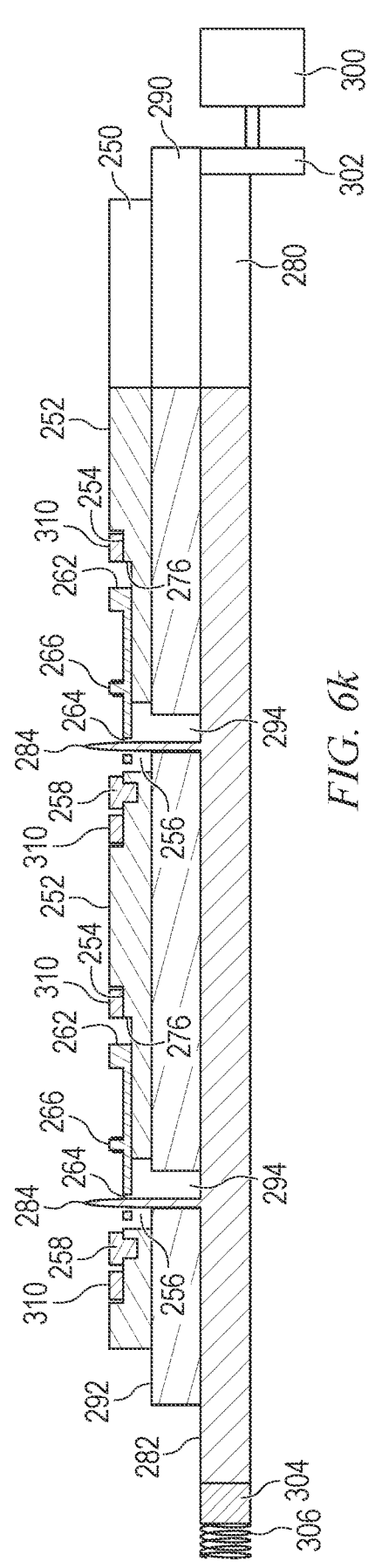
Figure 6L:
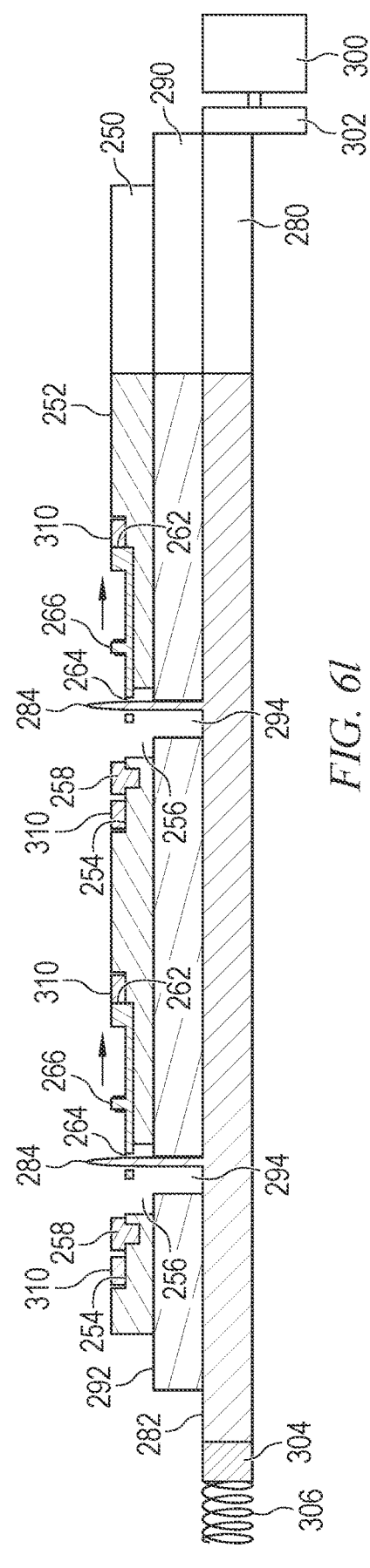
Figure 6M:
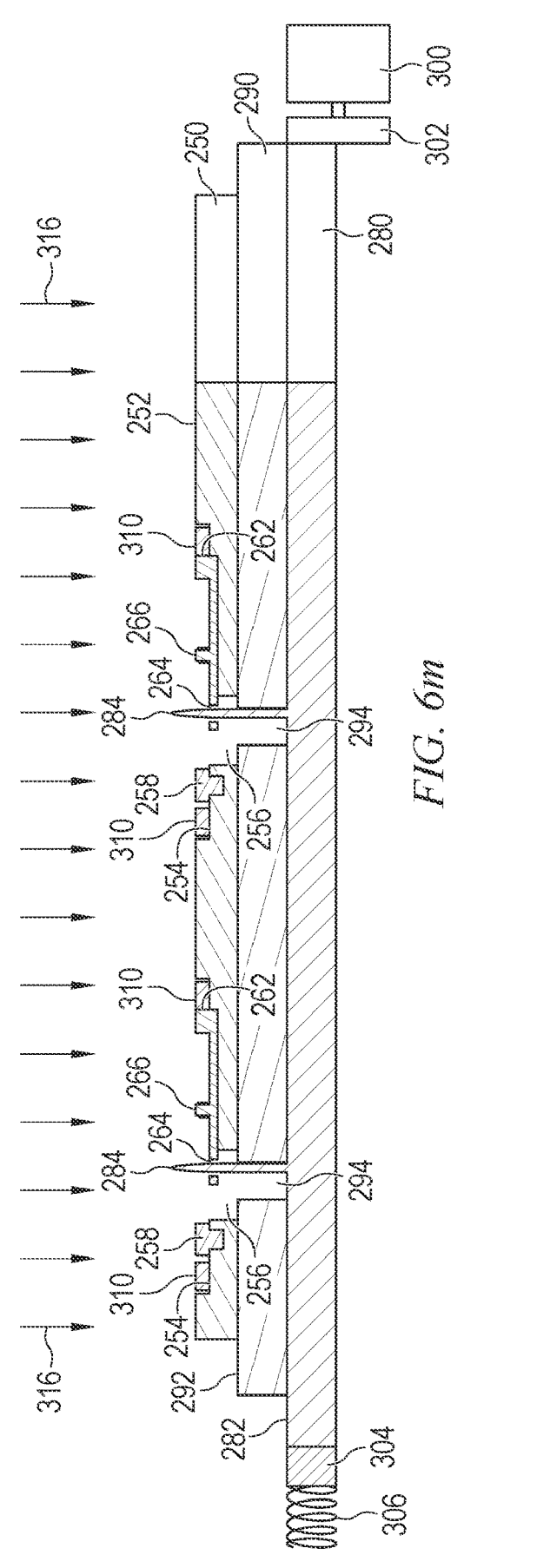
Figure 6N:
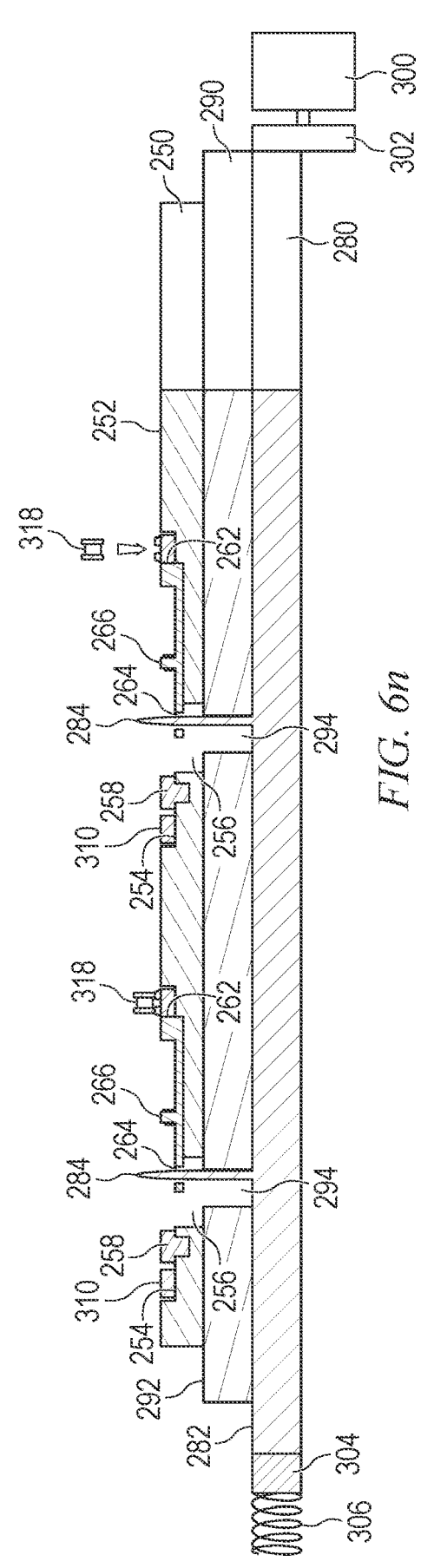
Figure 6O:
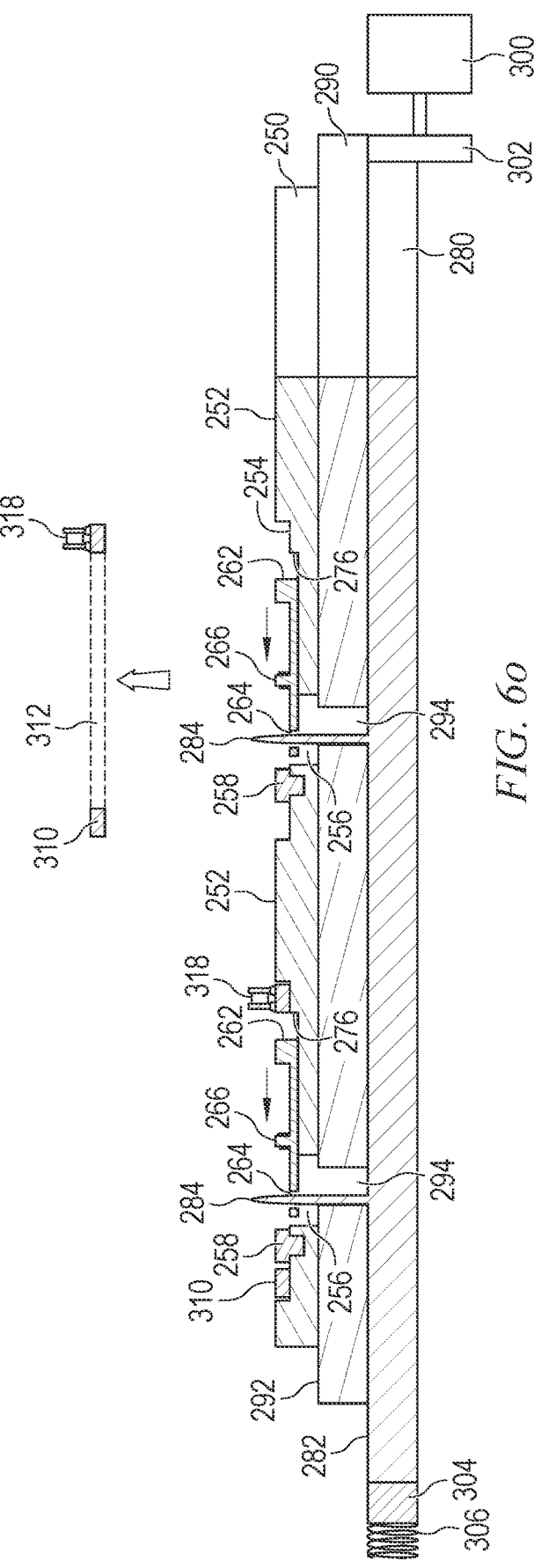

FIGS. 6a-6o illustrate a process of using carrier 250 to process aperture substrates. FIG. 6a shows a pin jig 280 with an alignment plate 290 disposed over the pin jig. In FIG. 6b, alignment plate 290 is disposed on the pin jig. Pin jig 280 includes a flat plate 282 and a plurality of retractor pins 284. Retractor pins 284 are configured to align to and fit within recesses 264 when carrier 250 is disposed above pin jig 280. Both plate 282 and retractor pins 284 are typically formed of a metal such as copper, aluminum, or stainless steel. Plate 282 can be sheet metal cut to the desired size and shape. Retractor pins 284 are screwed or press fit into plate 282 in some embodiments.

Alignment plate 290 includes a flat plate 292 with a plurality of alignment openings 294 formed through the alignment plate. Alignment openings 294 are configured to align to retractor pins 284 when alignment plate 290 is disposed over or on pin jig 280. Alignment openings 294 are sufficiently large to allow retractor pins 284 to move along the entire extent of the motion of movable datum 260 within alignment openings 294. Alignment plates 290 also include alignment pegs 296 extending upward from plate 292. Alignment pegs 296 are positioned and sized to fit within alignment openings 253 of carrier 250 when the carrier is disposed over and on alignment plate 290 as shown in FIGS. 6c and 6d. Flat plate 292 and alignment pegs 296 are both formed of metal, e.g., aluminum, copper, or stainless steel, or polymer. Alignment plate 290 is cut from sheet metal in one embodiment. Pegs 296 are screwed or press fit into plate 292 in some embodiments.

In use, alignment plate 290 is disposed over pin jig 280 as shown in FIG. 6a and then set down on the pin jig with each retractor pin 284 disposed within an opening 294 as shown in FIG. 6b. Next, carrier 250 is disposed over pin jig 280 and alignment plate 290 as shown in FIG. 6c and set down on the alignment plate with retractor pins 284 disposed through openings 256 and recesses 264 as shown in FIGS. 6d and 6f. FIG. 6d is an isometric perspective view while FIG. 6f is a cross-sectional view. FIG. 6d shows a completed carrier assembly comprising a stack of pin jig 280, alignment plate 290, and carrier 250. Retractor pins 284 are sufficiently tall over plate 282 of pin jig 280 to extend at least into if not completely through recesses 264.

The carrier assembly is disposed within an actuating system comprising an air cylinder 300 with push plate 302. The system includes a plate 304 with compression spring 306 at the opposite side of the carrier assembly from air cylinder 300. Air cylinder 300 and plate 304 are disposed at corners of carrier 250 so that air cylinder 300 can push against plate 304 in a direction parallel to the linear motion of movable datums 260. Air cylinder 300 is configured to expand push plate 302 towards pin jig 280 and thereby move the pin jig relative to alignment plate 290 and carrier 250 as shown in FIGS. 6e and 6g. FIG. 6e is an isometric perspective view while FIG. 6g is a cross-sectional view.

FIGS. 6e and 6g show air cylinder 300 expanding to move pin jig 280. The movement of pin jig 280 presses against plate 304 and compresses spring 306. A static element keeps alignment plate 290 and carrier 250 from moving with pin jig 280. The movement of pin jig 280 relative to carrier 250 causes retractor pins 284 to compress each movable datum 260 toward its respective static datum 258 at once. Openings 294 of alignment plate 290 are sufficiently large to accommodate the full range of motion of retractor pins 284. Openings 294 may be circular as illustrated in FIG. 6c or elongated along the path of retractor pins 284. Openings 256 may also be circular or oval instead of square or rectangular. Openings 256 and 294 are the same shape in some embodiments.

A plurality of aperture substrates 310 are disposed in receptacles 254 in FIG. 6h. FIGS. 6i and 6k show substrates 310 disposed in each receptacle 254. FIG. 6i is a plan view and FIG. 6k is a cross-sectional view. Aperture substrates 310 include square apertures 312 that fit around the compressed datums 258 and 260 in FIGS. 6i and 6k but not around the expanded datums. Receptacles 254 of carrier 250 can be configured shorter in depth than the height of substrates 310 so that the substrates stand slightly proud of top surface 252 to help process the substrates more efficiently. Alternatively, the top surfaces of substrates 310 can be coplanar to, or shorter than, surface 252.

Once a substrate 310 is disposed in each receptacle 254, air cylinder 300 is released and spring 306 returns pin jig 280 to its default position aligned to alignment plate 290 and carrier 250 as shown in FIGS. 6j and 6l. FIG. 6j is a plan view and FIG. 6l is a cross-sectional view. Springs 270 expand movable datum 260 away from static datum 258 until both the static and movable datums are pressing against the inner surfaces of substrate 310 within aperture 312. Having individual springs 270 for each positioning area 251 allows for proper pressure against each substrate 310 given slight variances in the manufacturing of the datums and the substrates. In other embodiments, springs 270 are not used and only the pressure of spring 306 is used through retractor pins 284 and movable datum 260 to keep substrates 310 secure.

With substrates 310 secured by static datum 258 and movable datum 260, the substrates can undergo any desired manufacturing processes. As only two examples, FIG. 6*m* shows depositing conductive or insulating layers over substrates 310, e.g., by sputtering, as represented by arrows 316. FIG. 6*n* illustrates placing electrical components 318 over substrates 310. Any desired active or passive components can be mounted onto substrate 310, e.g., semiconductor packages, bare die, or discrete components. Other processes include solder printing, solder reflow, and flux cleaning.

After the desired processing is completed, air cylinder 300 is again expanded to actuate pin jig 280 relative to carrier 250 and thereby compress movable datum 260 toward static datum 258 as shown in FIG. 6*o*. The movement of movable datum 260 releases the pressure that was being applied within aperture 312 to allow substrates 310 to be removed by a pick and place machine or process.

Substrates 310 have been processed while held by carrier 250. Holding substrates 310 securely with datums 258 and 260 improves efficiency and accuracy of processing. The use of movable datum 260 to secure substrates 310 eliminates the need of adhesive to secure the substrates, which is monetarily costly and complicates the manufacturing process. The need for cleaning excess adhesive from substrates 310 is eliminated. Carrier 250 can hold substrates 310 at a higher density than the prior art, thus improving productivity. For ceramic product manufacturing processes, the internal cavity tolerance is tighter than the external outline of the device. Therefore, using an internal cavity as a device datum will increase the process margin for manufacturing. Having the entire carrier assembly formed from metal allows the carrier to be utilized for processes requiring high temperature, e.g., up to 260 degrees Celsius. This includes a solvent jetting processes that can occur at up to 7 kgf/cm$^2$.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a first plate including a first opening and a second opening formed through the first plate;
disposing a tape on the first plate between the first opening and second opening;
disposing a second plate over the first plate, wherein the second plate has,
a trench aligned to the tape, wherein a first thickness of the second plate within the trench is less than a second thickness of the second plate adjacent to the trench, and wherein the tape is disposed in the trench while the second plate physically contacts the first plate adjacent to the trench, and
a third opening formed through the second plate in the trench over the tape;
disposing a singulated semiconductor package on the tape in the opening of the second plate, wherein the semiconductor package extends outside a footprint of the tape to overlap the first opening and second opening; and demounting the semiconductor package by inserting a tool through the first opening and second opening of the first plate.

2. The method of claim 1, further including:
removing the second plate; and
demounting the semiconductor package from the first plate and tape after removing the second plate.

3. The method of claim 1, further including inserting a pin of the first plate into an opening of the second plate.

4. The method of claim 1, further including disposing the second plate with a second fourth opening of the second plate aligned to a fifth opening of the first plate.

5. The method of claim 1, further including disposing the second plate in physical contact with the first plate.

6. The method of claim 1, further including making the first plate and second plate by milling a metal.

7. A method of making a semiconductor device, comprising:
providing a carrier including a static datum and a movable datum, wherein the movable datum is slidably coupled to the carrier and configured to slide linearly in a direction parallel to a top surface of the carrier;
moving the movable datum toward the static datum;
disposing an aperture substrate around the static datum and movable datum with the static datum and movable datum both within an opening of the aperture substrate;
releasing the movable datum after disposing the aperture substrate around the static datum and movable datum, wherein the movable datum moves away from the static datum to apply a pressure against internal surfaces of the opening of the aperture substrate; and
performing a manufacturing process on the aperture substrate after releasing the movable datum.

8. The method of claim 7, further including releasing the movable datum, wherein the movable datum is spring-loaded to apply pressure against an inner surface of the aperture substrate when released.

9. The method of claim 8, further including moving the movable datum toward the static datum for a second time after performing the manufacturing process to release the aperture substrate.

10. The method of claim 7, further including disposing the carrier over a pin jig, wherein the pin jig includes a pin extending through the movable datum.

11. The method of claim 10, further including using a plurality of pins of the pin jig to move a plurality of movable datums at once.

12. The method of claim 10, further including disposing an alignment plate between the pin jig and carrier.

13. A carrier for manufacturing a semiconductor device, comprising:
a plate;
a static datum attached to the plate in a fixed position;
a movable datum slidably attached to the plate, wherein the movable datum is configured to slide linearly in a direction parallel to a top surface of the plate;
a spring coupled between the plate and the movable datum, wherein the spring is configured to push the movable datum away from the static datum; and
a pin jig disposed under the plate, wherein the pin jig includes a pin extending through an opening of the movable datum.

14. The carrier of claim 13, wherein the plate includes a plurality of movable datums and the pin jig includes a plurality of pins, and wherein each pin extends through a respective opening of a respective movable datum.

15. The carrier of claim 13, further including an alignment plate disposed between the pin jig and plate.

16. The carrier of claim 13, further including an aperture substrate disposed with the static datum and movable datum in an opening of the aperture substrate.

17. The carrier of claim 16, wherein the movable datum applies a pressure to inner surfaces of the opening of the aperture substrate.

\* \* \* \* \*